(12) United States Patent
Tanaka et al.

(10) Patent No.: US 10,608,659 B2
(45) Date of Patent: Mar. 31, 2020

(54) A/D CONVERTER AND SEMICONDUCTOR DEVICE

(71) Applicant: RENESAS ELECTRONICS CORPORATION, Tokyo (JP)

(72) Inventors: Yasuyuki Tanaka, Tokyo (JP); Masaaki Tanimura, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 16/411,520

(22) Filed: May 14, 2019

(65) Prior Publication Data

US 2019/0386671 A1 Dec. 19, 2019

(30) Foreign Application Priority Data

Jun. 15, 2018 (JP) .................................. 2018-114597

(51) Int. Cl.
  *H03M 1/18* (2006.01)
  *H03M 1/34* (2006.01)
  *H03M 1/12* (2006.01)

(52) U.S. Cl.
  CPC ........... *H03M 1/183* (2013.01); *H03M 1/122* (2013.01); *H03M 1/34* (2013.01)

(58) Field of Classification Search
  CPC ..... G04F 10/005; H03M 1/1009; H03M 1/84; H03M 1/18; H03L 7/0991

USPC .......................................................... 341/155
See application file for complete search history.

(56) References Cited

U.S. PATENT DOCUMENTS

| 8,426,816 | B2 | 4/2013 | Sawada et al. | |
| 10,243,577 | B1 * | 3/2019 | Berens | H03M 1/1047 |
| 10,367,517 | B2 * | 7/2019 | Wu | H03M 1/442 |
| 10,483,995 | B1 * | 11/2019 | Lok | H03M 1/1042 |

FOREIGN PATENT DOCUMENTS

JP    2011-139259 A    7/2011

* cited by examiner

*Primary Examiner* — Brian K Young
(74) *Attorney, Agent, or Firm* — McDermott Will & Emery LLP

(57) ABSTRACT

An A/D converter includes an A/D conversion circuit for converting an analog output signal into a digital signal, and a control circuit for controlling the A/D conversion circuit. The control circuit acquires a digital signal of a first bit indicating which level regions the voltage level of the analog output signal corresponds to in accordance with a first conversion operation by the A/D conversion circuit, sets a reference voltage corresponding to the level region based on the first bit, amplifies the difference voltage between the analog output signal and the reference voltage to correspond to the A/D conversion input range of the A/D conversion circuit, outputs an amplified analog signal, acquires a digital signal of a second bit indicating the voltage level of the amplified analog signal in accordance with a second conversion operation by the A/D conversion circuit, and synthesizes the first bit and the second bit.

12 Claims, 16 Drawing Sheets

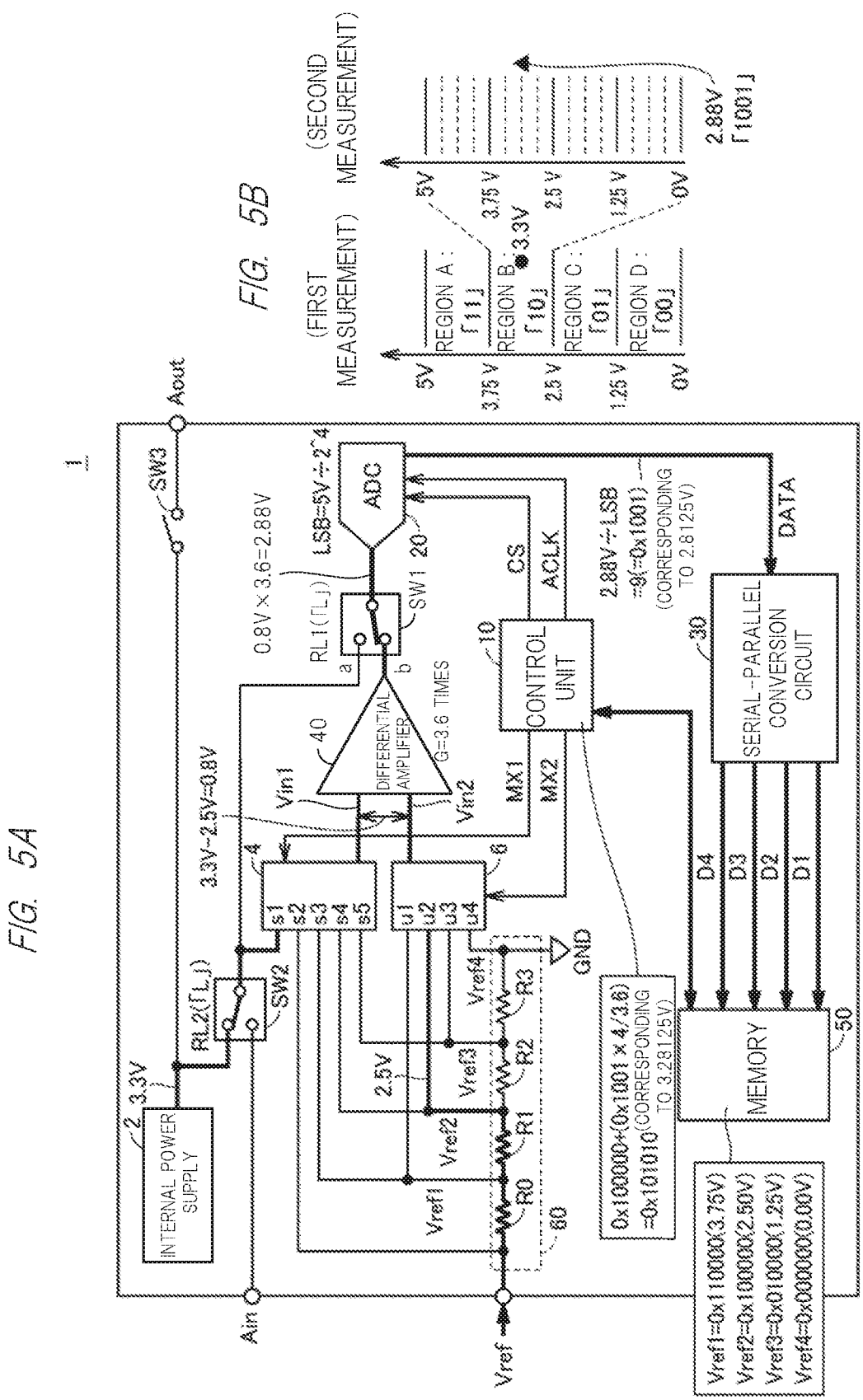

FIG. 6A

| D4 | D3 |
|---|---|
| 1 | 0 |

FIG. 6B

| D4 | D3 | D2 | D1 |
|---|---|---|---|
| 1 | 0 | 0 | 1 |

FIG. 6C

| Vref1 | 0 × 110000 |
|---|---|
| Vref2 | 0 × 100000 |
| Vref3 | 0 × 010000 |
| Vref4 | 0 × 000000 |

FIG. 7

|       | VOLTAGE[V] | DIFFERENCE |
|-------|------------|------------|
| Vref1 | 3.75       | 1.25       |
| Vref2 | 2.5        | 1.25       |
| Vref3 | 1.25       | 1.25       |
| Vref4 | 0          | —          |

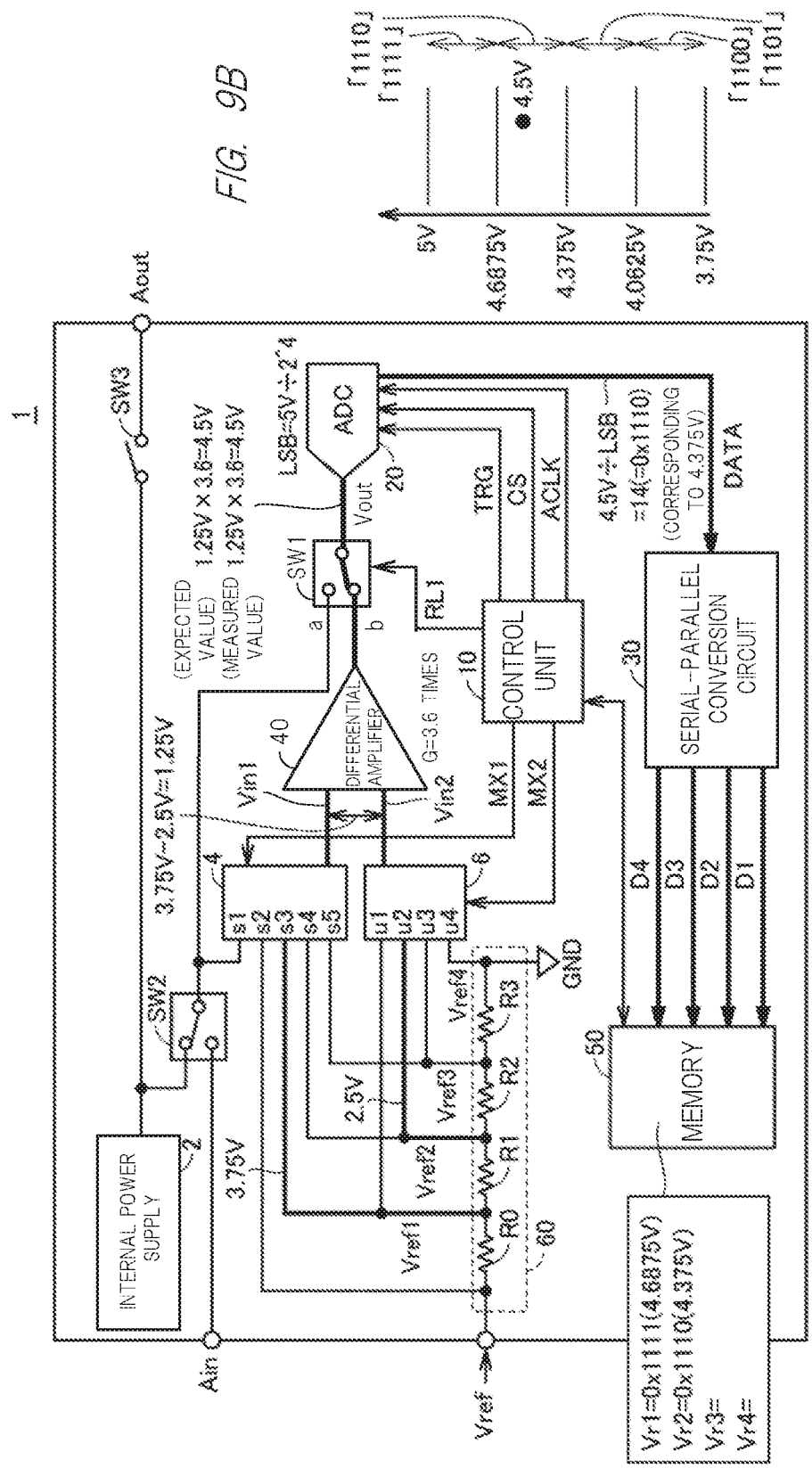

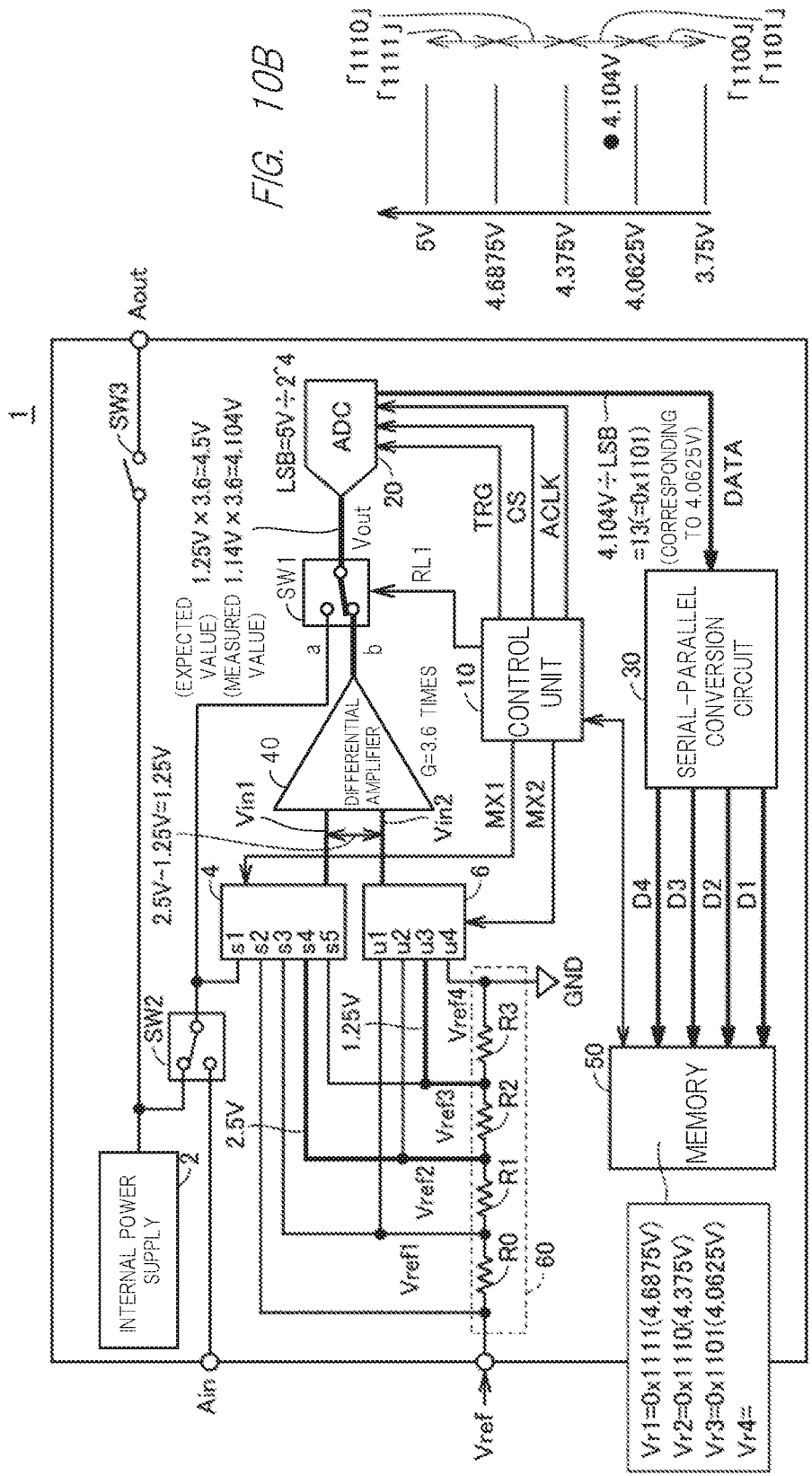

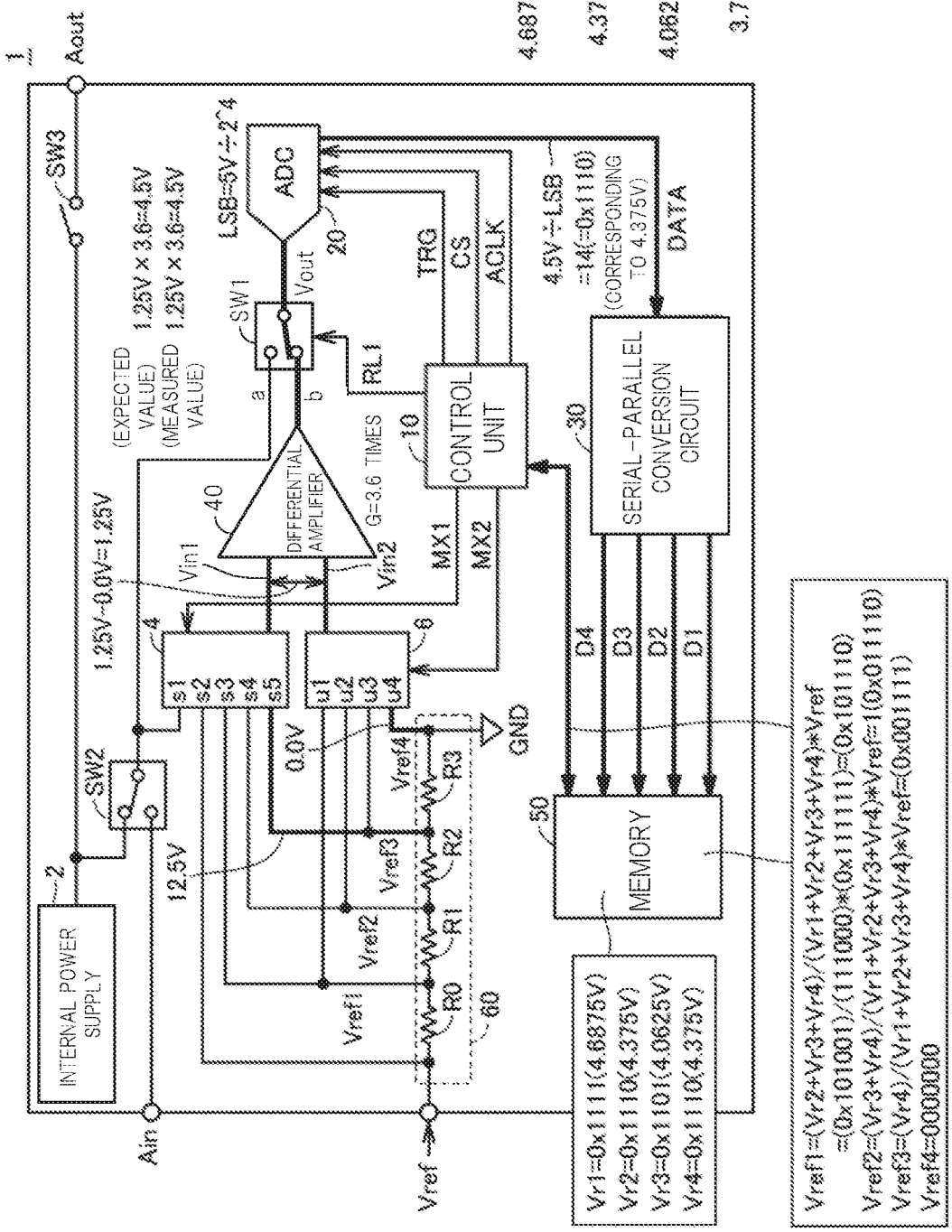

FIG. 14

| TABLE FOR STORING Vref (HIGH TEMPERATURE) |
|---|
| Vref1a=(Vr2+Vr3+Vr4)/(Vr1+Vr2+Vr3+Vr4)<br>Vref2a=(Vr3+Vr4)/(Vr1+Vr2+Vr3+Vr4)<br>Vref3a=(Vr4)/(Vr1+Vr2+Vr3+Vr4)<br>Vref4a=0 |
| TABLE FOR STORING Vref (NORMAL TEMPERATURE) |
| Vref1b=(Vr2+Vr3+Vr4)/(Vr1+Vr2+Vr3+Vr4)<br>Vref2b=(Vr3+Vr4)/(Vr1+Vr2+Vr3+Vr4)<br>Vref3b=(Vr4)/(Vr1+Vr2+Vr3+Vr4)<br>Vref4b=0 |
| TABLE FOR STORING Vref (LOW TEMPERATURE) |
| Vref1c=(Vr2+Vr3+Vr4)/(Vr1+Vr2+Vr3+Vr4)<br>Vref2c=(Vr3+Vr4)/(Vr1+Vr2+Vr3+Vr4)<br>Vref3c=(Vr4)/(Vr1+Vr2+Vr3+Vr4)<br>Vref4c=0 |
| TABLE FOR STORING Gn |
| Gn1=(Vref1a−Vref1c)/(TH−TL)<br>Gn2=(Vref2a−Vref2c)/(TH−TL)<br>Gn3=(Vref3a−Vref3c)/(TH−TL)<br>Gn4=(Vref4a−Vref4c)/(TH−TL) |
| TABLE FOR STORING Ot |
| Ot1=Vref1b−(Gn1 × TM)<br>Ot2=Vref2b−(Gn2 × TM)<br>Ot3=Vref3b−(Gn3 × TM)<br>Ot4=Vref4b−(Gn4 × TM) |

FIG. 16

| No | SW4 | SW5 | SW6 | SW7 | REFERENCE VOLTAGE GENERATED AT NODE Nd | CASE OF R0:R1:R2:R3=1:2:3:2 |
|---|---|---|---|---|---|---|
| 0 | OFF | OFF | ON | ON | GND | 0.00 |
| 1 | ON | OFF | ON | OFF | Vref{ R2 / (R0+R2) } | 3.75 |
| 2 | OFF | ON | ON | OFF | Vref{ R2 / (R1+R2) } | 3.00 |
| 3 | ON | ON | ON | OFF | Vref{ R2 / [(R0//R1)+R2] } | 4.09 |
| 4 | ON | OFF | OFF | ON | Vref{ R3 / (R0+R3) } | 3.33 |
| 5 | OFF | ON | OFF | ON | Vref{ R3 / (R1+R3) } | 2.50 |
| 6 | ON | ON | OFF | ON | Vref{ R3 / [(R0//R1)+R3] } | 3.75 |
| 7 | ON | OFF | ON | ON | Vref{ (R2//R3) / [R0+(R2//R3)] } | 2.73 |
| 8 | OFF | ON | ON | ON | Vref{ (R2//R3) / [R1+(R2//R3)] } | 1.88 |
| 9 | ON | ON | ON | ON | Vref{ (R2//R3) / [(R0//R1)+(R2//R3)] } | 3.21 |

|  | VOLTAGE[V] | DIFFERENCE | FIRST CONVERSION RESULT |
|---|---|---|---|
| Vref1 | 4.09 | 0.34 | 0x11010000 |
| Vref2 | 3.75 | 0.54 | 0x11000000 |
| Vref3 | 3.21 | 0.21 | 0x10110000 |
| Vref4 | 3.00 | 0.50 | 0x10100000 |
| Vref5 | 2.50 | 0.63 | 0x10000000 |
| Vref6 | 1.88 | 1.88 | 0x01100000 |
| Vref7 | 0 |  | 0x00000000 |

A/D CONVERTER AND SEMICONDUCTOR DEVICE

CROSS-REFERENCE TO RELATED APPLICATIONS

The disclosure of Japanese Patent Application No. 2018-114597 filed on Jun. 15, 2018 including the specification, drawings and abstract is incorporated herein by reference in its entirety.

BACKGROUND

The present disclosure relates to an A/D converter and a semiconductor device for converting an analog output signal into a digital signal.

Conventionally, multi-element sensors such as imaging devices have been widely used. The multi-element sensor desirably has a large dynamic range, and particularly, an X-ray imaging element, an infrared imaging element, or the like is required to have a large dynamic range.

The sensor or the like is provided with an A/D conversion circuit for converting an analog signal into a digital signal. The A/D conversion circuit is not limited to a sensor or the like, and may be used in various applications.

In this regard, Japanese unexamined Patent Application publication 2011-139259 discloses an A/D conversion circuit capable of expanding a resolution by using an A/D conversion circuit having a low resolution.

SUMMARY

However, in the A/D conversion circuit disclosed in Japanese unexamined Patent Application publication 2011-139259, a pre-A/D conversion circuit is provided in the preceding stage of the A/D conversion circuit to narrow down the voltage range in which the analog output signal falls. The resistance element for generating the reference voltage used in the pre-A/D conversion circuit and the resistance element for generating the reference voltage used in the A/D conversion circuit are provided independently of each other, and there is a possibility that the accuracy is deteriorated because the reference voltage varies due to variations in the resistance element.

The present disclosure has been made to solve the above-mentioned problems, and provides an A/D converter and a semiconductor device capable of A/D conversion with high accuracy by a simple method.

Other objects and novel features will become apparent from the description of this specification and the accompanying drawings.

An A/D converter according to an aspect of the present disclosure includes an A/D conversion circuit for converting an analog output signal into a digital signal of a plurality of bits, and a control circuit that controls the A/D conversion circuit. According to the first conversion operation by the A/D conversion circuit, the control circuit acquires the digital signal of a first bit indicating which of the plurality of level regions the voltage level of the analog output signal corresponds to, and sets the reference voltage corresponding to the level region based on the acquired first bit. In addition, the control circuit amplifies the difference voltage between the analog output signal and the reference voltage so as to correspond to the A/D conversion input range of the A/D conversion circuit, outputs the amplified analog output signal to the A/D conversion circuit as an amplified analog output signal, acquires a digital signal of a plurality of bits of a second bit indicating the voltage level of the amplified analog output signal according to the second conversion operation by the A/D conversion circuit, and synthesizes the digital signals of the first bit and the second bit.

According to one embodiment, the A/D converter of the present disclosure can perform A/D conversion with high accuracy in a simple manner.

BRIEF DESCRIPTION OF THE DRAWINGS

FIG. 5A and FIG. 5B are diagrams illustrating a second conversion operation in a normal mode of the A/D converter 1 according to the first embodiment.

FIG. 6A, FIG. 6B, and FIG. 6C are diagrams illustrating information stored in a memory 50 according to the first embodiment.

FIG. 7 is a diagram illustrating a relationship between each reference voltage and its difference based on the first embodiment.

FIG. 9A and FIG. 9B are diagrams illustrating an operation of measuring a voltage Vr2 between the resistance values in the correction mode of the A/D converter 1 according to the first embodiment.

FIG. 10A and FIG. 10B are diagrams illustrating an operation of measuring a voltage Vr3 between the resistance values in the correction mode of the A/D converter 1 according to the first embodiment.

FIG. 11A and FIG. 11B are diagrams illustrating an operation of measuring a voltage Vr4 between the resistance values in the correction mode of the A/D converter 1 according to the first embodiment.

FIG. 14 is diagram illustrating a correction table according to the second embodiment.

FIG. 16 is a diagram illustrating the reference voltage generated on a node Nd according to the control of switches SW4 to SW7 according to the third embodiment.

DETAILED DESCRIPTION

Figure 1:
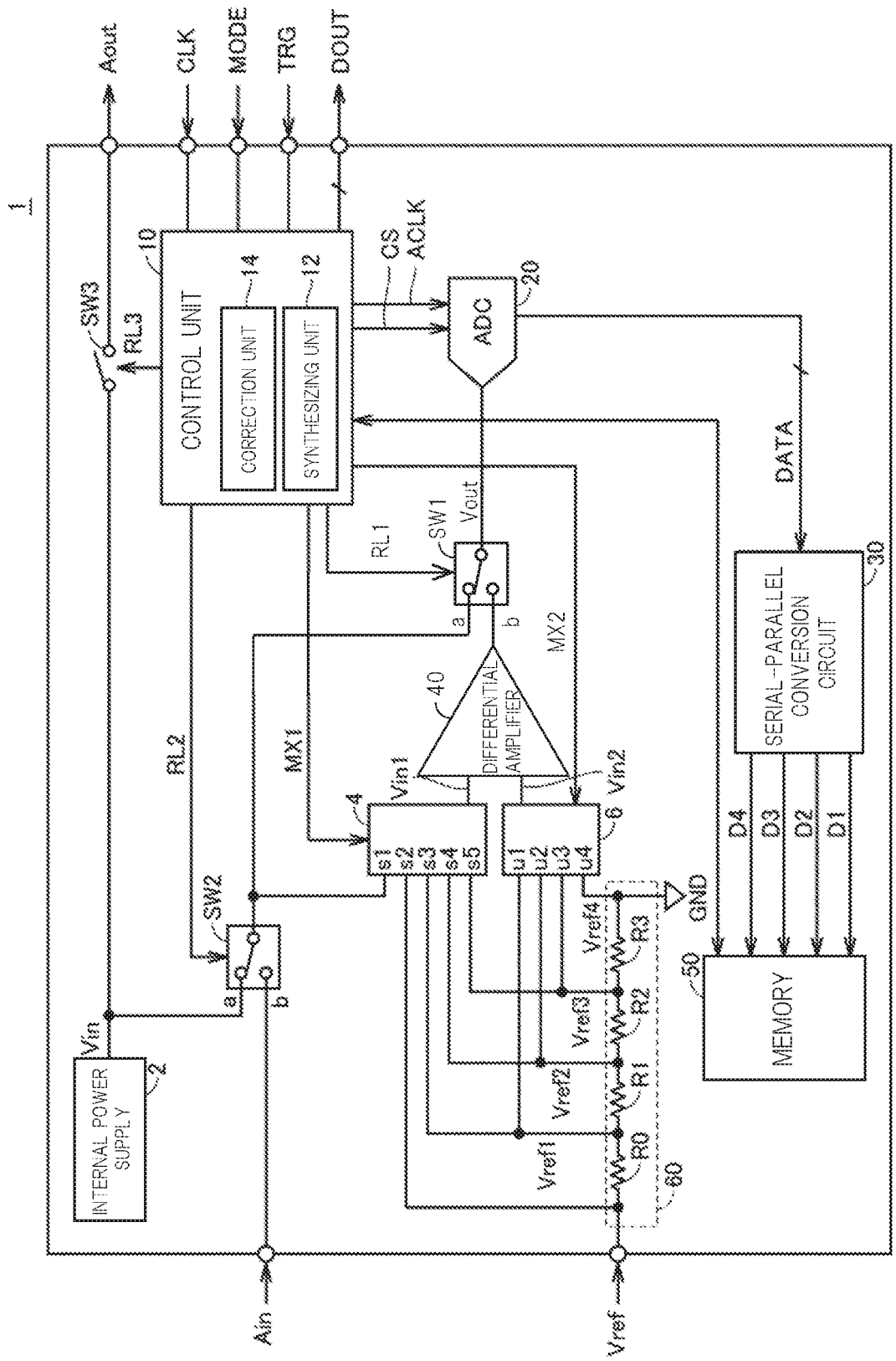
FIG. 1 is a diagram illustrating an A/D converter 1 according to a first embodiment.

Embodiments are explained in detail by referring to drawings. In the drawings, the same or corresponding components are denoted by the same reference numerals, and description thereof will not be repeated.

First Embodiment

FIG. 1 is a diagram illustrating an A/D converter 1 according to a first embodiment.

Referring to FIG. 1, an A/D converter 1 according to the first embodiment includes an internal power supply 2, switches SW1 to SW3, multiplexers 4 and 6, a differential amplifier 40, a control unit 10, an A/D conversion circuit 20 (also referred to as A/DC), a serial-parallel conversion circuit 30, a memory 50, and a reference voltage generation unit 60.

The internal power supply 2 generates and outputs a desired internal voltage Vin. In this embodiment, the internal voltage Vin can be output as an external output Aout from the external terminal via the switch SW3.

The switch SW3 operates in accordance with a control signal RL3 from the control unit 10. The switch SW3 turns on according to the control signal RL3 ("H" level) and outputs the internal voltage Vin as an external output Aout. On the other hand, the switch SW3 is turned off in accordance with the control signal RL3 ("L" level). Therefore, the external output Aout is not output.

The switch SW2 operates in accordance with a control signal RL2 from the control unit 10. Specifically, the switch SW2 switches the connection between the contacts a and ID and the output node. The switch SW2 connects the contact point a and the output node in accordance with the control signal RL2 ("L" level). On the other hand, the switch SW2 connects the contact point b and the output node in accordance with the control signal RL 2 ("H" level).

The switch SW2 receives the input of the internal voltage Vin at the contact point a. In addition, the external input Ain is received at the contact point b.

The reference voltage generator 60 includes a plurality of resistor elements R0 to R3. The plurality of resistive elements R0 to R3 are connected in series between the reference voltage Vref and the ground voltage GND. The reference voltage generator 60 outputs various reference voltages Vref1-Vref4 by resistive division.

The multiplexer 4 has five input nodes s1-s5 and selects one of the voltages inputted to the input nodes s1-s5 in accordance with the control signal MX1 to output as a voltage Vin1.

The multiplexer 6 has four input nodes u1 to u4 and selects one of the voltages inputted into the input nodes u1 to u4 accordance with the control signal MX2 to output as a voltage Vin2.

The input node s1 receives an input of an output signal of the switch SW2. The input node s2 receives an input of the reference voltage Vref.

The input node s3 receives the reference voltages Vref1 of the connecting node of the resistors R0 and R1.

The input node s4 receives the reference voltages Vref2 of the connecting node of the resistors R1 and R2.

The input node s5 receives the reference voltages Vref3 of the connecting node of the resistors R2 and R3.

The input node u1 receives the reference voltages Vref1 of the connecting node of the resistors R0 and R1.

The input node u2 receives the reference voltages Vref2 of the connecting node of the resistors R1 and R2.

The input node u3 receives the reference voltages Vref3 of the connecting node of the resistors R2 and R3.

The input node u4 receives the ground voltage GND as the reference voltage Vref4. The differential amplifier 40 amplifies the potential difference of the voltages Vin1, Vin2 and outputs an amplified analog voltage to the contact point b of the switch SW1.

The switch SW1 operates in accordance with a control signal RL1 from the control unit 10. Specifically, the switch SW1 switches the connection between the contacts a and b and the output node. The switch SW1 connects the contact point a and the output node in accordance with the control signal RL1 ("L" level). On the other hand, the switch SW1 connects the contact b and the output node in accordance with the control signal RL1 ("H" level).

The switch SW1 receives an output from the switch SW2 at the contact point a. The output signal of the differential amplifier 40 is input to the contact b. The switch SW1 outputs the analog output signal Vout to the A/D conversion circuit 20.

The A/D conversion circuit 20 performs A/D conversion on the analog output signal Vout, and outputs the processed signal as a data DATA. In this embodiment, the A/D conversion circuit 20 has a resolution for converting the analog output signal Vout into a 4-bit digital signals.

The serial-parallel conversion circuit 30 receives the data DATA outputted from the A/D conversion circuit 20, and outputs the data as parallel data D1 to D4 to the memory 50.

The memory 50 stores parallel data D1 to D4 output, from the serial-parallel conversion circuit 30.

In this embodiment, the A/D conversion circuit 20 performs a first and a second conversion operation on the analog output signal Vout. Then, the result of the A/D conversion processing by the first conversion operation and the second conversion operation is stored in the memory 50.

The control unit 10 includes a synthesizing unit 12 and a correction unit 14. The synthesizing unit 12 performs a synthesizing process on the data DATA stored in the memory 50, and outputs an output data DOUT via external pins.

In this embodiment, the memory 50 stores the data DATA according to the first conversion operation as a first bit. The memory 50 stores the data DATA according to the second conversion operation as a second bit.

The synthesizing unit 12 performs a synthesizing process based on the first bit and the second bit stored in the memory 50, and outputs the output data DOUT.

The correction unit 14 executes correction processing in the correction mode. The controller 10 operates in accordance with control signals MODE and TRC and a clock signal CLK inputted through external pins.

The control signals MODE switch between a normal mode and a correction mode in the A/D converter 1.

The A/D converter 1 performs an A/D conversion operation on the internal voltage Vin or the external input Ain in the normal mode.

The A/D converter 1 performs the correction operation of the digital signal corresponding to the reference voltage used in the A/D conversion operation in the correction mode.

The control signal TRG is a command signal for instructing the A/D conversion operation of the A/D conversion circuit 20.

The control unit 10 receives the input of the control signal TRG and instructs the A/D conversion circuit 20 to execute the A/D conversion operation. More specifically, the control unit 10 outputs the control signal CS ("L" level) to the A/D conversion circuit 20. The controller 10 outputs the inputted clock signal CLK to the A/D conversion circuit 20 as the internal clock signal ACLK.

The A/D conversion circuit 20 performs an A/D conversion operation for converting an analog signal into a digital signal based on the control signal CS and the internal clock signal ACLK.

The A/D converter 1 according to the first embodiment achieves a high resolution (6 bits as an example) A/D conversion by executing the A/D conversion operation of the A/D conversion circuit 20 that converts the analog signal into a digital signal twice.

Specifically, as an example, the A/D conversion circuit 20 has a resolution of a digital signal of 4 bits with respect to an analog signal.

The A/D converter 1 acquires a digital signal of the first bit by the first A/D conversion operation. Then, the A/D converter 1 acquires the digital signal of the second bit by the second A/D conversion operation. The A/D converter 1 performs synthesis processing based on the digital signals of the first bit and the second bit to obtain a digital signal having a resolution of 6 bits.

Figure 2:
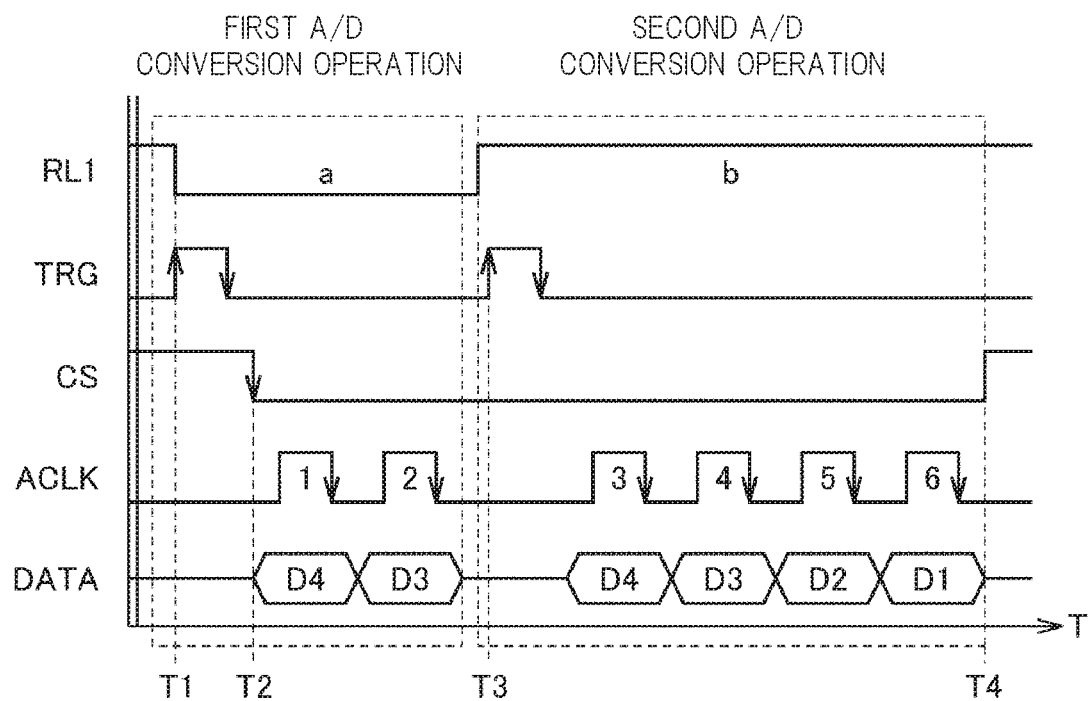
FIG. 2 is a diagram illustrating a timing chart of the A/D conversion operation of the A/D converter 1 according to the first embodiment.

FIG. 2 is a diagram for explaining a timing chart of the A/D conversion operation of the A/D converter 1 according to the first embodiment.

Referring to FIG. 2, control unit 10 receives control signal TRG ("H" level) at time T1. Accordingly, the control unit 10 sets the control signal RL1 ("L" level). The switch SW1 connects the contact point a and the output node.

The control unit 10 outputs a control signal CS ("L" level) to the A/D conversion circuit 20 at time T2. The A/D conversion circuit 20 is activated in response to the control signal CS ("L" level), and performs an A/D conversion operation on the analog signal in accordance with the internal clock signal ACLK. In this embodiment, two-bit data D4 and D3 are outputted to the two-cycle of the internal clock signal ACLK. The data D4 and D3 correspond to the upper 2 bits.

Next, the control unit 10 receives a control signal TRG ("H" level) at time T3. Accordingly, the control unit 10 sets the control signal RL1 ("H" level). The switch SW1 connects the contact point b and the output node.

The control unit 10 performs the A/D conversion operation on the analog signal in accordance with the internal clock signal ACLK after the transition to the time T3. In this embodiment, 4-bit data D4, D3, D2, and D1 are outputted to four cycles of the internal clock signal ACLK. The data D4, D3, D2, D1 correspond to the lower 4 bits.

The A/D converter 1 performs the first A/D conversion operation in accordance with the first two internal clock signals ACLK. Then, the A/D converter 1 performs the second A/D conversion operation in accordance with the following four internal clock signals ACLK.

The A/D converter 1 in this example outputs a 6-bit digital signal by two A/D conversion operations.

Figure 3:
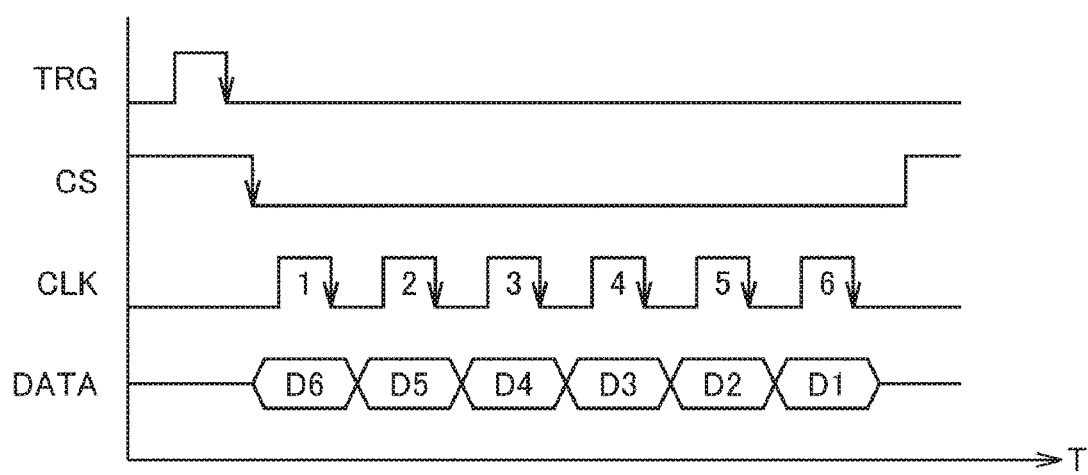
FIG. 3 is a schematic diagram illustrating a timing chart of a conventional A/D converter provided as a comparative example.

FIG. 3 is a diagram illustrating a timing chart of a conventional A/D converter provided as a comparative example.

In FIG. 3, a timing chart of an A/D converter having a resolution of 6 bits will be described as a comparative example.

In the case of an A/D converter having a 6-bit resolution, a 6-bit digital signal is acquired in accordance with an input of a 6-cycle clock signal CLK.

Referring to FIG. 2 and FIG. 3, when comparing the A/D converter 1 having 4-bit resolution and the A/D converter of the comparative example having 6-bit resolution, the A/D converter of the comparative example having higher resolution can execute the A/D conversion processing at higher speed.

However, even when the A/D converter 1 having a low resolution for performing two A/D conversion operations is used, the A/D conversion operation is delayed only by about one cycle of the clock signal, which is considered to have a small influence. In addition, it is possible to realize an A/D converter with high resolution by using an A/D conversion circuit with low resolution, and it is possible to reduce the cost.

(Normal Mode)

The control unit 10 switches between the normal mode and the correction mode in the A/D converter 1 in accordance with the control signals MODE.

First, the A/D conversion operation for the internal voltage Vin or the external input Ain in the normal mode of the A/D converter 1 according to the first embodiment will be described.

As an example, the A/D conversion operation of the internal voltage Vin (3.3V) of the internal power supply 2 will be described.

FIG. 4 is a diagram for explaining the first conversion operation in the normal mode of the A/D converter 1 according to the first embodiment.

Figure 4A:
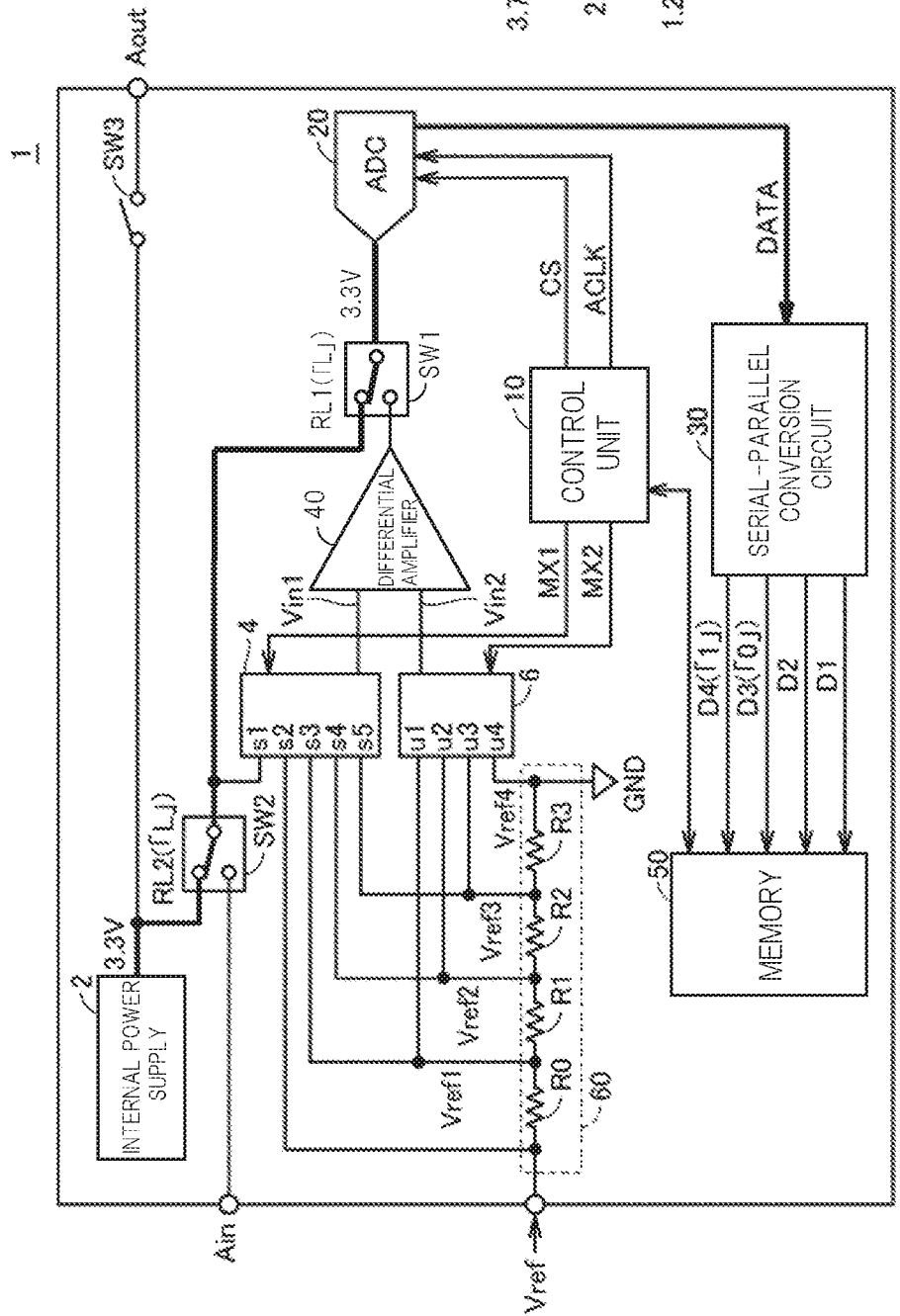
FIG. 4A and FIG. 4B are diagrams illustrating a first conversion operation in a normal mode of the A/D converter 1 according to the first embodiment.

Referring to FIG. 4(A), control unit 10 outputs control signals RL1 and RL2 ("L" level) to switches SW1 and SW2. The A/D conversion circuit 20 receives the analog output signal Vout (3.3V). In the first conversion operation, the differential amplifier 40 is not used.

The A/D conversion circuit 20 according to the first embodiment outputs 2-bit digital signals D4 and D3 as the first bit in the first conversion operation for the analog output signal Vout.

Figure 4B:
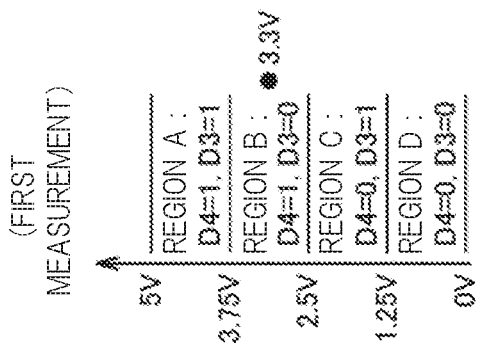

FIG. 4(B) is a diagram illustrating a voltage detection range of the A/D conversion circuit 20. Referring to FIG. 4(B), the A/D conversion circuit 20 has a voltage detection range of 0 to 5 V as an example.

The A/D conversion circuit 20 divides the voltage detection range of 0 to 5V into four regions A to D, and outputs two-bit digital signals D4 and D3 as the first bit.

The region D is set in the range of 0V to 1.25V, and the digital signals D4 and D3 are assigned to "0" and "0". The region C is set in the range of 1.25V to 2.5V, and the digital signals D4 and D3 are assigned to "0" and "1". The region B is set in the range of 2.5V to 3.75 V, and the digital signals D4 and D3 are assigned to "1" and "0". The region A is set in the range of 3.75V to 5V, and the digital signals D4 and D3 are assigned to "1" and "1".

In this embodiment, the A/D conversion circuit 20 outputs "1" and "0" as the digital signals D4 and D3 in response to inputs of the analog output signal Vout (3.3V).

The serial-parallel conversion circuit 30 receives the output data. DATA of the A/D conversion circuit 20, converts the received output data into parallel signals, and stores the parallel signals in the memory 50.

FIG. 5 is a diagram for explaining the second conversion operation in the normal mode of the A/D converter 1 according to the first embodiment.

Referring to FIG. 5A, control unit 10 outputs control signals RL1 ("H" level) and RL2 ("L" level) to switches SW1 and SW2.

The internal power supply 2 outputs an internal voltage Vin (3.3V), for example. In the second conversion operation, the control unit 10 outputs the control signals MX1 and MX2 to operate the differential amplifier 40.

Specifically, the control unit 10 outputs the control signal MX1 to the multiplexer 4 in the second conversion operation.

The multiplexer 4 selects the input node s1 according to the control signal MX1 and outputs the voltage Vin1 (3.3V) to the differential amplifier 40.

The control unit 10 outputs the control signal MX2 to the multiplexer 6 based on the digital signals D4 and D3 stored in the memory 50.

Based on the digital signals D4 and D3, the control unit 10 outputs a control signal MX2 for the multiplexer 6 to select a reference voltage close to the internal voltage Vin1.

The reference voltage Vref is set to 5V as an example. The reference voltages Vref1, Vref2, Vref3, and Vref4 are set to 3.75V, 2.5V, 1.25V, and 0V, respectively, according to the resistance division of the resistance elements R0 to R3.

The control unit 10 outputs the control signal MX2 to select the input node u1 (reference voltage Vref1 (3.75V)) based on the digital signals D4 and D3 ("1" and "1"). For the digital signals D4 and D3 ("1" and "1"), the internal voltages Vin1 are included in the region A. Therefore, the control unit 10 instructs the multiplexer 6 to select the reference voltage Vref1 close to the inner voltage Vin1 included in the region A.

The control unit 10 outputs the control signal MX2 to select the input node u2 (reference voltage Vref2 (2.5V)) based on the digital signals D4 and D3 ("1" and "0"). For the digital signals D4 and D3 ("1" and "0"), the internal voltages Vin1 are included in the region B. Therefore, the control unit 10 instructs the multiplexer 6 to select the reference voltage Vref2 close to the inner voltage Vin1 included in the region B.

The control unit 10 outputs the control signal MX2 to select the input node u3 (reference voltage Vref3 (1.25V)) based on the digital signals D4 and D3 ("0" and "1"). For the digital signals D4 and D3 ("0" and "1"), the internal voltages Vin1 are included in the region C. Therefore, the control unit 10 instructs the multiplexer 6 to select the reference voltage Vref3 close to the inner voltage Vin1 included in the region C.

The control unit 10 outputs the control signal MX2 so as to select the input node u4 (the reference voltage Vref4 (0V)) based on the digital signals D4 and D3 ("0" and "0"). For the digital signals D4 and D3 ("0", "0"), the internal voltages Vin1 are included in the region D. Therefore, the controller 10 instructs the multiplexer 6 to select the reference voltage Vref4 close to the inner voltage Vin1 included in the region D.

In this embodiment, since the digital signal is the digital signals D4 and D3 ("1" and "0"), the multiplexer 6 selects the reference voltage Vref2 (2.5V) and outputs the selected reference voltage to the differential amplifier 40 as the internal voltage Vin2.

In this example, the control unit 10 outputs the control signal MX2 for controlling the multiplexer 6 in accordance with the digital signals D4 and D3. On the other hand, the present invention is not particularly limited thereto, and the digital signals D4 and D3 may be inputted to the multiplexer 6, and any one of the reference voltages Vref1-Vref4 may be selected in the multiplexer 6 by a logical circuit operating in accordance with the digital signals D4 and D3. In this case, the processing speed can be increased because the control unit 10 is not interposed.

The differential amplifier 40 amplifies the difference between the internal voltage Vin1 and the internal voltage Vin2 in accordance with the amplification gain G and outputs the amplified difference. As an example, the amplification gain G is set to 3.6 times.

When the amplification gain G is quadrupled, the conversion operation in the 100% range with respect to the voltage detection range 0 to 5V of the A/D conversion circuit 20 is executed.

In the case of this example, when the amplification gain G is 3.6 times, the conversion operation in the range of 90% is performed with respect to the voltage detection range 0 to 5V of the A/D conversion circuit 20.

The difference voltage between the internal voltage Vin1 and the internal voltage Vin2 is 0.8V. Therefore, the analog output signal Vout of the differential amplifier 40 is set to 0.8×amplification gain G (3.6)=2.88V.

The A/D conversion circuit 20 according to the first embodiment receives the analog output signal Vout of 2.88V and performs a second conversion operation on the analog output signal Vout. In the second conversion operation, the A/D conversion circuit 20 outputs the 4-bit digital signals D4, D3, D2, and D1 of the second bit.

FIG. 5(B) is a diagram illustrating a voltage detection range of the A/D conversion circuit 20. Referring to FIG. 5(B), the A/D conversion circuit 20 has a voltage detection range of 0 to 5 V as an example.

As described with reference to FIG. 4(B), in the first measurement, the A/D conversion circuit 20 performs the conversion operation in the voltage detection range 0 to 5V with respect to the internal voltage Vin1 (3.3V). The A/D conversion circuit 20 divides the voltage detection range of 0 to 5V into four regions and outputs two-bit digital signals D4 and D3.

In this embodiment, the internal voltage Vin1 (3.3V) is included in the region B corresponding to the digital signals D4 and D3 ("1" and "0").

Next, in the second measurement, the A/D conversion circuit 20 performs the conversion operation in the voltage detection range 0 to 5V in accordance with the amplification gain G on the analog output voltage Vout, which is the difference voltage between the internal voltage Vin1 (3.3V) and the internal voltage Vin2 (2.5V).

The A/D conversion circuit 20 divides the voltage detection range of 0 to 5V into 16 regions and outputs 4-bit digital signals D4, D3, D2, and D1.

The analog output signal Vout (2.88V) is included in the region B as described with reference to FIG. 4. Accordingly, the digital signals D4 and D3 are "10".

In this example, the voltage detection range of 2.5V to 3.75V of the region B is further divided into four regions. The analog output signal Vout (2.88V) ds included in the range of 2.8125V to 3.125V out of the four regions. Therefore, the digital signals D2 and D1 are "01".

Therefore, the A/D conversion circuit 20 receives the analog output signal Vout (2.88V), and outputs the 4-bit digital signals D4 to D1 ("1001") as the second bit by the A/D conversion operation.

The serial-parallel conversion circuit 30 receives the output data DATA of the A/D conversion circuit 20, converts the received output data into parallel signals, and stores the parallel, signals in the memory 50.

FIG. 6 is a diagram for explaining information stored in the memory 50 according to the first embodiment.

Referring to FIG. 6(A), the digital signals D4 and D3 are stored as "10" as the output data DATA of the first conversion operation.

Referring to FIG. 6(B), the digital signals D4 to D1 are stored as "1001" as the output data DATA of the second conversion operation.

Referring to FIG. 6(C), here, digital signals corresponding to the voltage values of the reference voltage Vref1-Vref4 are stored. Specifically, "0x110000" is stored corresponding to the reference voltage Vref1 (3.75V). "0x100000" is stored corresponding to the reference voltage Vref2 (2.5V). 0x010000 is stored corresponding to the reference voltage Vref3 (1.25V). "0x000000" is stored corresponding to the reference voltage Vref4 (0V).

Referring back to FIG. 5, the synthesizing unit 12 of the control unit 10 performs a synthesizing process based on the output data DATA of the first conversion operation stored in the memory 50 and the output data DATA of the second conversion operation stored in the memory 50.

Specifically, the synthesizing unit 12 refers to the digital signals D4 and D3 ("10") which are the output data DATA of the first conversion operation stored in the memory 50.

Based on the digital signals D4 and D3, the synthesizing unit 12 acquires, as a digital signal of the analog output signal Vout, a digital signal corresponding to the reference voltage Vref2 close to the analog output signal Vout according to the first conversion operation. In this example, the synthesizing unit 12 acquires "0x100000".

Next, the synthesizing unit 12 refers to the digital signals D4 to D1 ("1001") which are the output data DATA of the second conversion operation stored in the memory 50.

Here, the output data DATA of the second conversion operation by the A/D conversion circuit 20 is the output data in the range of 90% in which the amplifying gain G is set to 3.6 times.

The synthesizing unit 12 calculates the output data DATA when the A/D conversion circuit 20 performs the conversion operation in the 100% range as shown in the following equation.

$$0x1001 \times 4/3.6 = 0x1010$$

The synthesizing unit 12 outputs, as a digital signal of the analog output signal Vout, a digital signal corresponding to the reference voltage Vref2 close to the analog output signal Vout according to the first conversion operation and a digital signal corresponding to the difference voltage between the inner voltage Vin and the reference voltage Vref2 as a synthesized digital signal.

The synthesizing unit 12 adds "0x100000" corresponding to the reference voltage Vref2 and "0x1010" corresponding to the difference voltage, and outputs the result as output data DOUT ("0x101010").

The output data DOUT (0x101010) of the A/D conversion circuit 20 having a 6-bit resolution corresponds to the output data of 3.28125V in the voltage detection range of 0 to 5V.

The measurement error with respect to the internal voltage Vin is 3.3V−3.28125=0.01875V.

Therefore, the A/D converter 1 according to the first embodiment can execute an A/D conversion operation with high accuracy.

In this example, the case where the internal voltage Vin of the internal power supply 2 is measured has been described as an example, but the present invention is not particularly limited thereto.

Specifically, it is also possible to measure the external input Ain. Specifically, it is possible to perform the A/D conversion operation of 6 bits of the external input Ain in accordance with the same method as described above by switching and measuring the contact point b by the switch SW2.

The method according to the first embodiment can perform the A/D conversion operation with high accuracy in a simple method by expanding the resolution by using the A/D conversion circuit 20 twice.

Further, unlike the conventional method, since the reference voltage generator 60 is one, it is possible to avoid deterioration in accuracy due to variations in the reference voltage caused by variations in the resistance element.

(Correction Mode)

The control unit 10 switches between the normal mode and the correction mode in the A/D converter 1 in accordance with the control signals MODE.

The correction unit 14 executes processing in the correction mode. Next, the correction operation of the digital signal corresponding to the reference voltage used in the A/D conversion operation in the correction mode of the A/D converter 1 according to the first embodiment will be described.

Specifically, data of digital signals corresponding to the reference voltages Vref1-Vref4 are stored in the memory 50, respectively, and the digital signals are corrected as required.

Specifically, a case where the reference voltage Vref is 5V will be considered as an example. FIG. 7 is a diagram for explaining the relationship between each reference voltage and its difference according to the first embodiment.

As shown in FIG. 7, when the resistance elements R0 to R3 have the same resistance values, the reference voltages Vref1-Vref4 are set to 3.75V, 2.5V, 1.25V, and 0V by resistance division based on the resistance elements R0 to R3.

On the other hand, there is a possibility that the ratio of the resistance values may vary due to variations in the resistance elements R0 to R3 or the like. Accordingly, the reference voltages Vref1-Vref4 may deviate from the assumed idealized values.

In the correction mode, the correction unit 14 measures the voltages Vr1 to Vr4 between the respective resistance values of the resistance elements R0 to R3.

The correction unit 14 calculates the actual reference voltage Vref1-Vref4 based on the measured results, i.e., the voltages Vr1 to Vr4.

Then, the correction unit 14 corrects the digital signal to the digital signal corresponding to the calculated reference voltage Vref1-Vref4 and stores the digital signal in the memory 50.

By this processing, it is possible to execute an A/D conversion operation with high accuracy. FIG. 8 is a diagram for explaining an operation of measuring the voltage Vr1 between resistance values in the correction mode of the A/D converter 1 according to the first embodiment.

Figures 8A, 8B:
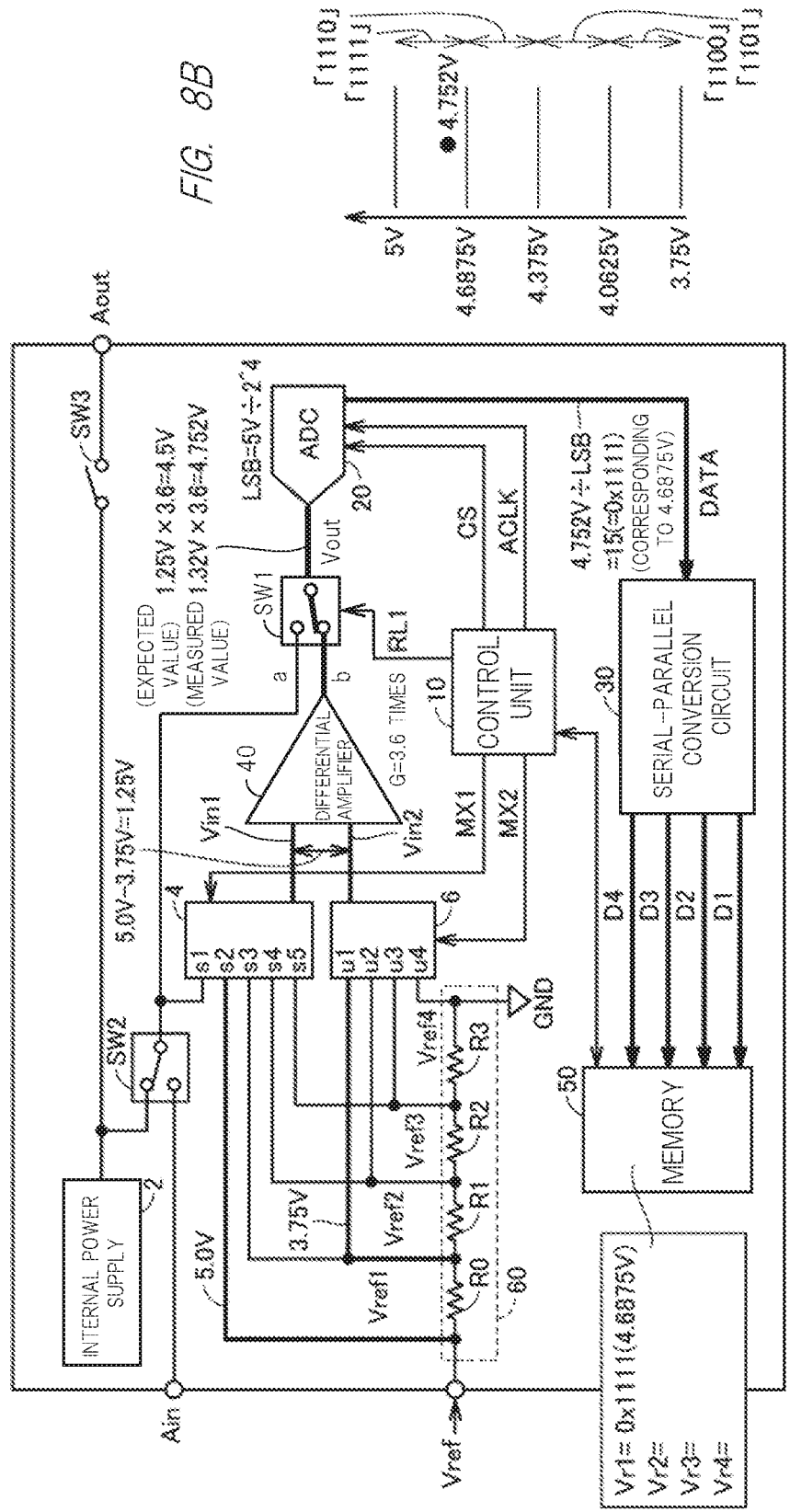
FIG. 8A and FIG. 8B are diagrams illustrating an operation of measuring a voltage Vr1 between the resistance values in the correction mode of the A/D converter 1 according to the first embodiment.

Referring to FIG. 8(A), the correction unit 14 outputs a control signal RL1 ("H" level) to the switch SW1.

In this embodiment, the A/D converting operation is performed on the difference voltage between the reference voltage Vref and the reference voltage Vref1 (the voltage between the resistors Vr1).

The correction unit 14 outputs the control signals MX1 and MX2 to operate the differential amplifier 40. Specifically, the correction unit 14 outputs the control signal MX1 to the multiplexer 4.

The multiplexer 4 selects the input node s2 in accordance with the control signal MX1, and outputs the selected input node s2 to the differential amplifier 40 at a voltage Vin1 (5.0V). The correction unit 14 outputs the control signal MX2 to the multiplexer 6. The multiplexer 6 selects the input node u1 according to the control signal MX2 and outputs the voltage Vin2 (3.75V) to the differential amplifier 40.

The differential amplifier 40 amplifies the difference between the internal voltage Vin1 and the internal voltage Vin2 in accordance with the amplification gain G and outputs the amplified difference. As an example, the amplification gain G is set to 3.6 times.

The difference voltage between the internal voltage Vin1 and the internal voltage Vin2 is 1.25V. Therefore, the analog output signal Vout of the differential amplifier 40 is set to 1.25×amplification gain G (3.6)=4.5V.

The A/D conversion circuit 20 according to the first embodiment receives an analog output signal Vout (4.5V) and performs an A/D conversion operation on the analog output signal Vout.

On the other hand, it is assumed that the difference voltage between the internal voltage Vin1 and the internal voltage Vin2 (the voltage between the resistors Vr1) is 1.32V.

Therefore, the analog output signal Vout of the differential amplifier 40 is set to 1.32×amplification gain G (3.6) =4.752V (measured value).

FIG. 8B is a diagram illustrating a voltage detection range of the A/D conversion circuit 20. Referring to FIG. 8B, the A/D conversion circuit 20 has a voltage detection range of 0 to 5V as an example.

The A/D conversion circuit 20 divides the voltage detection range of 0 to 5V into 16 regions and outputs 4-bit digital signals D4, D3, D2, and D1.

The analog output signal Vout (4.752V) is included in region A as described in FIG. 4. Accordingly, the digital signals D4 and D3 are "11".

In this example, a voltage detection range of 3.75V to 5V in region A is further divided into four regions.

The analog output signal Vout (4.752V) is included in the range of 4.6875 to 5V of the four regions. Therefore, the digital signals D2 and D1 are "11".

Accordingly, the A/D conversion circuit 20 receives the input of the analog output signal Vout (4.752V) and outputs the 4-bit digital signals D4 to D1 ("1111") by the A/D conversion operation.

The serial-parallel conversion circuit 30 receives the output data DATA of the A/D conversion circuit 20, converts the received output data into parallel signals, and stores the parallel signals in the memory 50.

More specifically, the memory 50 stores "0x1111" in association with the voltage Vr1 between the resistance values.

FIG. 9 is a diagram for explaining the operation of measuring the voltage Vr2 between the resistance values in the correction mode of the A/D converter 1 according to the first embodiment.

Referring to FIG. 9A, the correction unit 14 outputs control signal RL1 ("H" level) to switch SW1.

In this embodiment, the A/D conversion operation is performed on the difference voltage between the reference voltage Vref1 and the reference voltage Vref2 (the voltage between the resistors Vr2).

The correction unit 14 outputs the control signals MX1 and MX2 to operate the differential amplifier 40. Specifically, the correction unit 14 outputs the control signal MX1 to the multiplexer 4.

The multiplexer 4 selects the input node s3 according to the control signal MX1 and outputs the voltage Vin1 (3.75V) to the differential amplifier 40.

The correction unit 14 outputs the control signal MX2 to the multiplexer 6. The multiplexer 6 selects the input node u2 in accordance with the control signal MX2, and outputs the selected input node u2 to the differential amplifier 40 at a voltage Vin2 (2.5V).

The differential amplifier 40 amplifies the difference between the internal voltage Vin1 and the internal voltage Vin2 in accordance with the amplification gain G and outputs the amplified difference. As an example, the amplification gain G is set to 3.6 times.

The difference voltage between the internal voltage Vin1 and the internal voltage Vin2 is 1.25 V. Therefore, the analog output signal Vout of the differential amplifier 40 is set to 1.25×amplification gain G (3.6)=4.5V.

The A/D conversion circuit 20 according to the first embodiment receives an analog output signal Vout (4.5V) and performs an A/D conversion operation on the analog output signal Vout.

Here, it is assumed that the difference voltage between the internal voltage Vin1 and the internal voltage Vin2 (the voltage between the resistances Vr2) is 1.25V.

Therefore, the analog output signal Vout of the differential amplifier 40 is set to 1.25×amplification gain G (3.6)=4.5V (measured value).

FIG. 9(B) is a diagram illustrating a voltage detection range of the A/D conversion circuit 20. Referring to FIG. 9(B), the A/D conversion circuit 20 has a voltage detection range of 0 to 5V as an example.

The A/D conversion circuit 20 divides the voltage detection range of 0 to 5V into 16 regions and outputs 4-bit digital signals D4, D3, D2, and D1.

The analog output signal Vout (4.5V) is included in region A as described in FIG. 4. Accordingly, the digital signals D4 and D3 are "11".

In this example, a voltage detection range of 3.75V to 5V in region A is further divided into four regions.

The analog output signal Vout (4.5V) is included in the range of 4.375 to 4.6875V of the four regions. Accordingly, the digital signals D2 and D1 are "10".

Therefore, the A/D conversion circuit 20 receives the analog output signal Vout (4.5V) and outputs the 4-bit digital signals D4 to D1 ("1110") by the A/D conversion operation.

The serial-parallel conversion circuit 30 receives the output data DATA of the A/D conversion circuit 20, converts the received output data into parallel signals, and stores the parallel signals in the memory 50.

More specifically, the memory 50 stores "0x1110" in association with the voltage Vr2 between the resistance values.

FIG. 10 is a diagram for explaining the operation of measuring the voltage Vr3 between the resistance values in the correction mode of the A/D converter 1 according to the first embodiment.

Referring to FIG. 10(A), the correction unit 14 outputs a control signal RL1 ("H" level) to the switch SW1.

In this embodiment, the A/D conversion operation is performed on the difference voltage between the reference voltage Vref2 and the reference voltage Vref3, i.e., the voltage Vr3 between the resistors.

The correction unit 14 outputs the control signals MX1 and MX2 to operate the differential amplifier 40. Specifically, the correction unit 14 outputs the control signal MX1 to the multiplexer 4.

The multiplexer 4 selects the input node s4 according to the control signal MX1, and outputs the selected input node s4 to the differential amplifier 40 at a voltage Vin1 (2.5V).

The correction unit 14 outputs the control signal MX2 to the multiplexer 6. The multiplexer 6 selects the input node u3 in accordance with the control signal MX2, and outputs the input node u3 with a voltage Vin2 (1.25V) to the differential amplifier 40.

The differential amplifier 40 amplifies the difference between the internal voltage Vin1 and the internal voltage Vin2 in accordance with the amplification gain G and outputs the amplified difference. As an example, the amplification gain G is set to 3.6 times.

The difference voltage between the internal voltage Vin1 and the internal voltage Vin2 is 1.25V. Therefore, the analog output signal Vout of the differential amplifier 40 is set to 1.25×amplification gain G (3.6)=4.5V.

The A/D conversion circuit 20 according to the first embodiment receives an analog output signal Vout (4.5V) and performs an A/D conversion operation on the analog output signal Vout.

Here, it is assumed that the difference voltage between the internal voltage Vin1 and the internal voltage Vin2, i.e., the voltage Vr3 between the resistances is 1.14V.

Therefore, the analog output, signal Vout of the differential amplifier 40 is set to 1.14×amplification gain G (3.6) =4.104V (measured value).

FIG. 10(B) is a diagram illustrating a voltage detection range of the A/D conversion circuit 20. Referring to FIG. 10(B), the A/D conversion circuit 20 has a voltage detection range of 0 to 5V as an example.

The A/D conversion circuit 20 divides the voltage detection range of 0 to 5V into 16 regions and outputs 4-bit digital signals D4, D3, D2, and D1.

The analog output signal Vout (4.104V) is included in the region A as described with reference to FIG. 4. Accordingly, the digital signals D4 and D3 are "11".

In this example, a voltage detection range of 3.75V to 5V in region A is further divided into four regions.

The analog output signal Vout (4.104V) is included in the range of 4.0625 to 4.375V out of the four regions. Therefore, the digital signals D2 and D1 are "01".

Therefore, the A/D conversion circuit 20 receives the analog output signal Vout (4.104V), and outputs the 4-bit digital signals D4 to D1 ("1101") by the A/D conversion operation.

The serial-parallel conversion circuit 30 receives the output data DATA of the A/D conversion circuit 20, converts the received output data into parallel signals, and stores the parallel signals in the memory 50.

More specifically, the memory 50 stores "0x1101" in association with the voltage Vr3 between the resistance values.

FIG. 11 is a diagram for explaining the operation of measuring the voltage Vr4 between the resistance values in the correction mode of the A/D converter 1 according to the first embodiment.

Referring to FIG. 11(A), the correction unit 14 outputs a control signal RL1 ("H" level) to the switch SW1.

In this embodiment, the A/D conversion operation is performed on the difference voltage between the reference voltage Vref3 and the reference voltage Vref4, i.e., the voltage Vr4 between the resistors.

The correction unit 14 outputs the control signals MX1 and MX2 to operate the differential amplifier 40. Specifically, the correction unit 14 outputs the control signal MX1 to the multiplexer 4.

The multiplexer 4 selects the input node s5 according to the control signal MX1 and outputs the voltage Vin1 (1.25V) to the differential amplifier 40.

The correction unit 14 outputs the control signal MX2 to the multiplexer 6. The multiplexer 6 selects the input node u4 according to the control signal MX2 and outputs the voltage Vin2 (0V) to the differential amplifier 40.

The differential amplifier 40 amplifies the difference between the internal voltage Vin1 and the internal voltage Vin2 in accordance with the amplification gain G and outputs the amplified difference. As an example, the amplification gain G is set to 3.6 times.

The difference voltage between the internal voltage Vin1 and the internal voltage Vin2 is 1.25V. Therefore, the analog output signal Vout of the differential amplifier 40 is set to 1.25×amplification gain G (3.6)=4.5V.

The A/D conversion circuit 20 according to the first embodiment receives an analog output signal Vout of 4.5V and performs an A/D conversion operation on the analog output signal Vout.

Here, it is assumed that the difference voltage between the internal voltage Vin1 and the internal voltage Vin2, i.e., the voltage Vr4 between the resistors, is 1.25V.

Therefore, the analog output signal Vout of the differential amplifier 40 is set to 1.25×amplification gain G (3.6)=4.5V (measured value).

FIG. 11(B) is a diagram illustrating a voltage detection range of the A/D conversion circuit 20. Referring to FIG. 11(B), the A/D conversion circuit 20 has a voltage detection range of 0 to 5V as an example.

The A/D conversion circuit 20 divides the voltage detection range of 0 to 5V into 16 regions and outputs 4-bit digital signals D4, D3, D2, and D1.

The analog output signal Vout (4.5V) is included, in region A as described in FIG. 4. Accordingly, the digital signals D4 and D3 are "11".

In this example, a voltage detection range of 3.75V to 5V in region A is further divided into four regions.

The analog output signal Vout (4.5V) is included in the range of 4.375 to 4.6875V of the four regions. Accordingly, the digital signals D2 and D1 are "10".

Therefore, the A/D conversion circuit 20 receives the analog output signal Vout (4.5V) and outputs the 4-bit digital signals D4 to D1 ("1110") by the A/D conversion operation.

The serial-parallel conversion circuit 30 receives the output data DATA of the A/D conversion circuit 20, converts the received output data into parallel signals, and stores the parallel signals in the memory 50.

More specifically, the memory 50 stores "0x1110" in association with the voltage Vr4 between the resistance values.

Accordingly, data of digital signals corresponding to the voltages Vr1 to Vr4 between the resistance values are stored in the memory 50.

The reference voltage Vref is the sum of the voltages Vr1 to Vr4. The reference voltage Vref1 is the sum of the voltages Vr2 to Vr4.

Considering the ratios, Vref1/Vref=(Vr2+Vr3+Vr4)/(Vr1+Vr2+Vr3+Vr4) holds.

Therefore, when "0x111111" is set for the reference voltage Vref, the reference voltage Vref1 can be calculated as (Vr2+Vr3+Vr4)/(Vr1+Vr2+Vr4)×the reference voltage Vref.

In binary, the reference voltage Vref is calculated as "0x101110" and stored in the memory 50.

According to the same method, the reference voltage Vref2 can be calculated as (Vr3+Vr4)/(Vr1+Vr2+Vr3+Vr4)× the reference voltage Vref.

In binary, the reference voltage Vref2 is calculated as "0x011110" and stored in the memory 50.

The reference voltage Vref3 can be calculated as (Vr4)/(Vr1+Vr3+Vr4)×the reference voltage Vref.

In binary, the reference voltage Vref3 is calculated as "0x0011111." and stored in the memory 50.

The reference voltage Vref4 is "0x000000". The correction unit 14 corrects the data of the digital signals corresponding to the reference voltages from Vref1 to Vref4 stored in the memories 50 by the above-described processing.

As a result, it is assumed that the digital signals D4 and D3 ("10") are stored as the output data DATA of the first conversion operation in the normal mode. It is also assumed that the digital signals D4 to D1 ("1001") are stored as the output data DATA of the second conversion operation.

The synthesizing unit 12 refers to the digital signals D4 and D3 ("10") which are the output data DATA of the first conversion operation stored in the memory 50.

Based on the digital signals D4 and D3, the synthesizing unit 12 acquires, as a digital signal of the analog output signal Vout, a digital signal corresponding to the reference voltage Vref2 close to the analog output signal Vout according to the first conversion operation. In this example, the synthesizing unit 12 acquires "0x0111.10".

Next, the synthesizing unit 12 refers to the digital signals D4 to D1 ("1001") which are the output data. DATA of the second conversion operation stored in the memory 50.

Here, the output data DATA of the second conversion operation by the A/D conversion circuit 20 is the output data in the range of 90% in which the amplifying gain G is set to 3.6 times.

The synthesizing unit 12 calculates the output data DATA of the output data when the A/D conversion circuit 20 performs the conversion operation in the 100% range as shown in the following equation.

0x1001×4/3.6=0x1010. The synthesizing unit 12 adds "0x011110" corresponding to the reference voltage Vref2 and "0x1010" corresponding to the difference voltage, and outputs the result as output data DOUT ("0x101000").

The correction operation of the digital signal corresponding to the reference voltage is performed by the method according to the correction mode described above. This makes it possible to perform the A/D conversion operation with high accuracy.

The correction process of the digital signals corresponding to the reference voltages Vref1-Vref4 by the correction unit 14 according to the correction mode may be executed at predetermined timings prior to the execution of the normal mode, or may be executed every elapse of a predetermined period.

Second Embodiment

Figure 12:
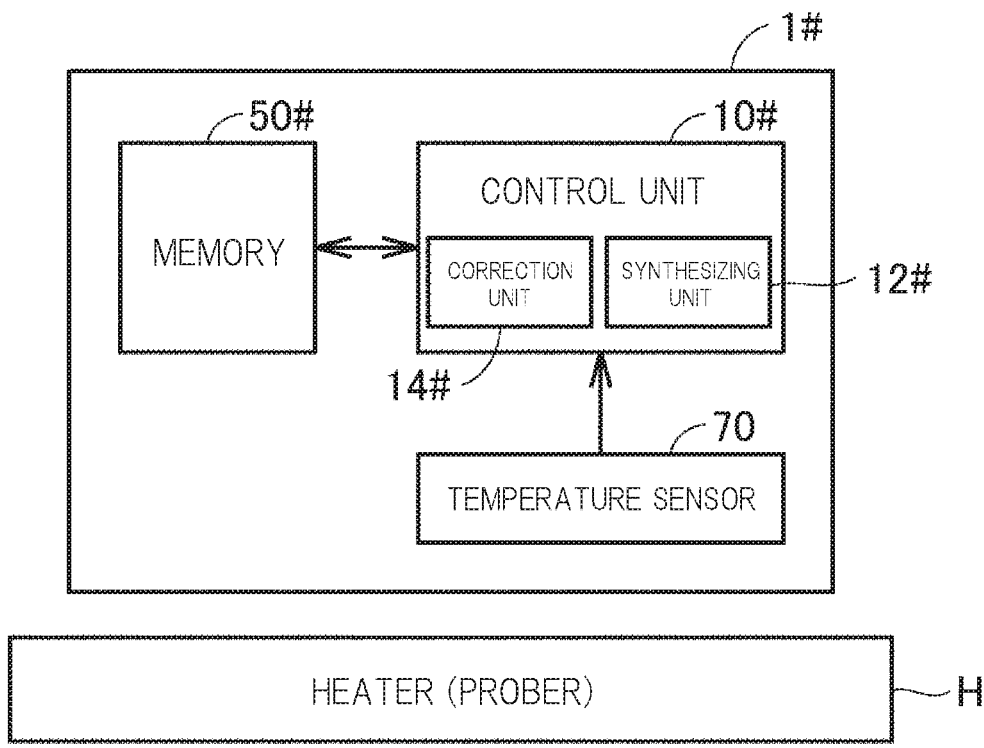
FIG. 12 is a diagram illustrating a concept of an A/D converter 1# according to a second embodiment.

FIG. 12 is a diagram for explaining the concept of the A/D converter 1# according to the second embodiment.

Referring to FIG. 12, the A/D converter 1# according to the second embodiment further includes a temperature sensor 70. Further, the control unit 10 is replaced with the control unit 10#. The memory 50 is replaced with a memory 50#. Other configurations are basically the same as those described with reference to FIG. 1. In this example, the part is omitted.

The temperature sensor 70 detects the temperature of the surrounding environment and outputs the detected temperature to the control unit 10#. The memory 50# includes a correction table for correcting the digital signal corresponding to the reference voltage according to the temperature.

The control unit 10# includes a synthesizing unit 12# and a correction unit 14#. The synthesizing unit 12# performs a synthesizing process based on the first bit and the second bit stored in the memory 50, and outputs the output data DOUT.

The correction unit 14# corrects the digital signal corresponding to the reference voltage according to the temperature with reference to the correction table stored in the memory 50#.

In this example, a heater H is provided outside the A/D converter 1# to create a correction table.

Figure 13:
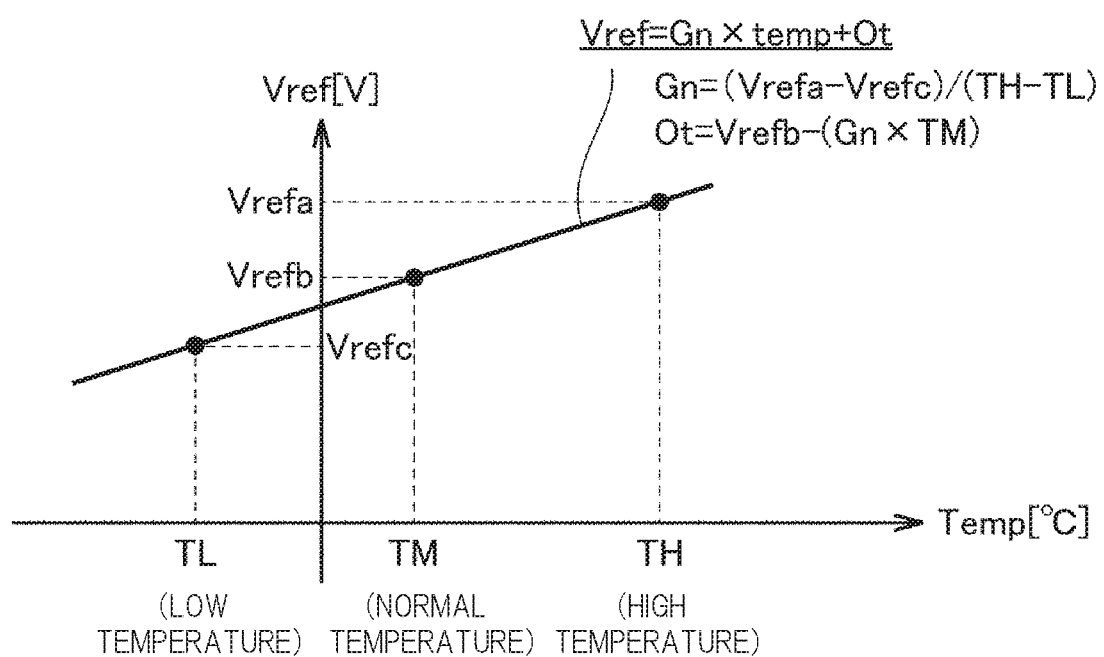
FIG. 13 is a diagram illustrating a reference voltage that varies according to a temperature according to the second embodiment.

FIG. 13 is a diagram illustrating a reference voltage that changes in accordance with the temperature according to the second embodiment.

Referring to FIG. 13, the reference voltage Vref changes according to the temperature TL (low temperature), the temperature TM (normal temperature), and the temperature TH (high temperature). As an example, a case of linearly changing according to a predetermined linear function is shown. At this point, the reference voltage Vref changes because the resistor values for setting the reference voltage change in accordance with temperatures.

In the present embodiment, the reference voltage Vref=Vrefc, Vrefb, Vrefa of each of the three states of the temperature TL (low temperature), the temperature TM (normal temperature), and the temperature TH (high temperature) is measured, and the slope Gn and the offset value Ot of the linear function for calculating the reference voltage based on the measurement result are calculated.

The linear functions are expressed as reference voltages Vref=slope Gn×temperature temp offset Ot.

The slope Gn is calculated by (Vrefa Vrefc)/(TH−TL). The offset value Ot is calculated by Vrefb−Gn×TM.

In this embodiment, with respect to the reference voltages Vref1-Vref4, respective linear functions that change in accordance with temperatures are calculated.

Specifically, in order to calculate the slope Gn and the offset value Ot, the heaters H are driven to detect the values of the reference voltages Vref1~Vref4 in the three states of the temperature TL, the temperature TM (normal temperature), and the temperature TH (high temperature).

Then, the inclination Gn and the offset value Ot are calculated according to the above method. The calculation result is stored in the memory 50#.

As an example, a specific example of measurement of the reference voltages Vref1 will be described. In the condition of the temperature TH (high temperature), Vref1$a$=3.825V is measured (temperature TH=+100° C.) In addition, Vref1$b$=3.750V is measured in the condition of the temperature TM (normal temperature) (temperature TM=+25° C.) Vref1$c$=3.675V is measured under the temperature TL (low temperature) (temperature TL=−50° C.). The slope Gn1 of the reference voltage Vref1 is calculated as 0.001 based on the above equation. The offset value Ot1 is calculated as 3.725.

The reference voltage Vref1 is 0.001×temperature temp+3.725. When 30° C. is measured by the temperature sensor 70, the reference voltage Vref1 is 0.001×30+0.3725=3.755V.

It is possible to correct according to the linear function. The other reference voltage Vref2~Vref4 can be calculated in the same manner as the reference voltage Vref1.

FIG. 14 is a diagram illustrating a correction table according to the second embodiment. Referring to FIG. 14, a table for storing the value of the reference voltage Vref, a table for storing the value of the slope Gn, and a table for storing the offset value Ot are provided as the correction table.

As the value of the reference voltage Vref1-Vref4, a value at a high temperature, a value at a normal temperature, and a value at a low temperature are stored.

Specifically, the reference voltage Vref1a~Vref4a is calculated in accordance with the voltages Vr1 to Vr4 between the respective resistance values of the resistance elements R0 to R3 measured at a high temperature.

Specifically, the reference voltage Vref1a is calculated as Vref1a=(Vr2+Vr3+Vr4)/(Vr1+Vr2+Vr3+Vr4). The reference voltage Vref2a is calculated as Vref2a=(Vr3+Vr4)/(Vr1+Vr2+Vr3+Vr4). The reference voltage Vref3a is calculated as Vref3a=(Vr4)/(Vr1+Vr2+Vr3+Vr4). The reference voltage Vref4a is calculated as 0.

The reference voltages Vref1b~Vref4b and Vref1c~Vref4c can also be calculated in accordance with the voltages Vr1 to Vr4 between the respective resistance values of the resistance elements R0 to R3 measured at normal temperature and low temperature.

The slope Gn1 can be calculated by (Vref1a-Vref1c)/(TH-TL). The offset value Ot1 can be calculated from the offset value Vref1b-(Gn1×TM).

The same applies to the other slopes Gn2 to Gn4 and the offset values Ot2 to Ot4. The correction unit 14# of the control unit 10# calculates the reference voltages Vref1~Vref4 corresponding to the temperatures based on the table storing the values of the slopes Gn and the table storing the offset values.

The correction unit 14# stores the digital signals corresponding to the reference voltages Vref1~Vref4 corresponding to the calculated temperatures in the memory 50#.

As a result, it is assumed that the digital signals D4 and D3 ("10") are stored as the output data DATA of the first conversion operation in the normal mode. It is also assumed that the digital signals D4 to D1 ("1001") are stored as the output data DATA of the second conversion operation.

The synthesizing unit 12# refers to the digital signals D4 and D3 ("10") as the output data DATA of the first conversion operation stored in the memory 50#.

The synthesizing unit 12# acquires, as a digital signal of the analog output signal Vout based on the digital signals D4 and D3, a digital signal corresponding to the reference voltage Vref2 close to the analog output signal Vout according to the first conversion operation.

In this case, the correction unit 14# stores the digital signal corresponding to the reference voltage Vref2, which is changed according to the temperature, in the memory 50#.

The synthesizing unit 12# acquires digital signals corresponding to the corrected reference voltages Vref2 stored in the memory 50#.

Then, the digital signal corresponding to the reference voltage Vref2 and the digital signal corresponding to the difference voltage are added and output as output data ROUT according to the same method as described above.

According to this method, it is possible to perform a correction process in accordance with a reference voltage that changes according to temperature, and it is possible to perform an A/D conversion operation with high accuracy.

The correction process of the digital signals corresponding to the reference voltages Vref1~Vref4 corresponding to the respective temperatures by the correction unit 14# according to the correction mode may be executed at predetermined timings prior to the execution of the normal mode, or may be executed every elapse of a predetermined period.

Third Embodiment

Figure 15:
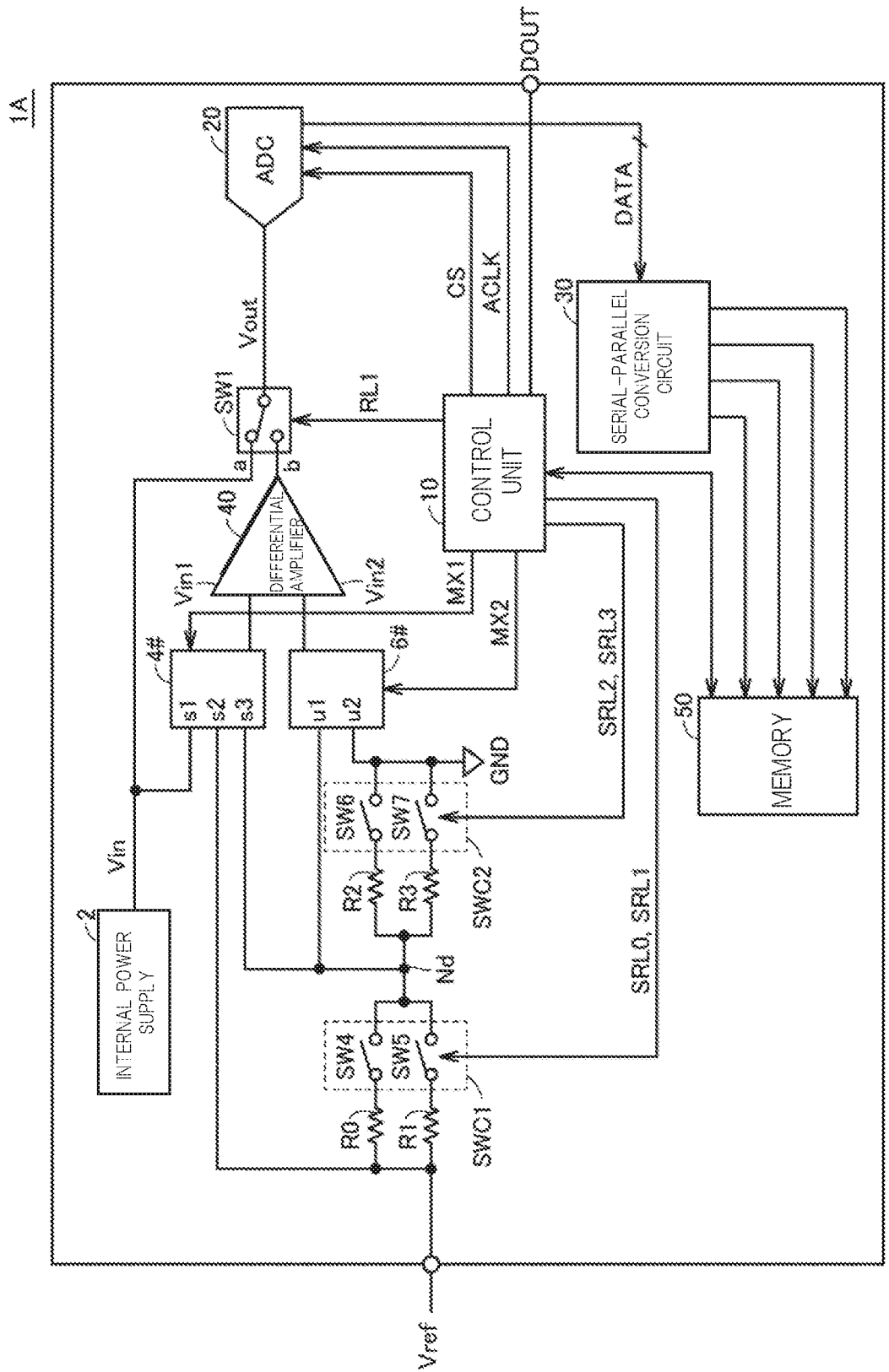
FIG. 15 is a diagram illustrating a configuration of an A/D converter 1A according to a third embodiment.

FIG. 15 is a diagram illustrating a configuration of an A/D converter 1A according to a third embodiment.

Referring to FIG. 15, an A/D converter 1A according to the third embodiment has a configuration in which switches SW2 and SW3 are deleted as compared with the A/D converter 1 of FIG. 1. In this configuration, the A/D conversion operation is not performed on the external input Ain, and the A/D conversion operation is performed only on the internal voltage Vin. It should be noted that the present invention is not particularly limited thereto, and the A/D conversion operation for the external input Ain may be executed. The control signals MODE and TRG and the clock signal CLK inputted to the control unit 10 are omitted. The control unit 10 includes a synthesizing unit 12 and a correction unit 14 (not shown).

The A/D converter 1A has changed the configuration of the reference voltage generator 60. More specifically, a switch control unit SWC1, SWC2 for changing the connection relation of the plurality of resistor elements R0 to R3 is provided.

The switch control unit SWC1 includes switches SW4 and SW5. The switches SW4 and SW5 operate in accordance with the control signals SRL0, SRL1, respectively.

The switch control unit SWC2 includes switches SW6 and SW7. The switches SW6 and SW7 operate in accordance with the control signals SRL2, SRL3, respectively.

The control unit 10 outputs control signals SRL0~SRL3, respectively. The resistive element R0 is connected in series with the switch SW4. The resistive element R1 is connected in series with the switch SW5. The resistive element R0 and the switch SW4, and the resistive element R1 and the switch SW5 are connected in parallel with each other between the reference voltages Vref and the nodes Nd.

The resistive element R2 is connected in series with the switch SW6. The resistive element R3 is connected in series with the switch SW7. The resistive element R2 and the switch SW6, and the resistive element R3 and the switch SW7 are connected in parallel with each other between the node Nd and the ground voltage GND.

The connecting relation of the resistive elements R0 to R3 can be changed in accordance with combinations of inputs of the control signals SRL0-SRL3.

The second embodiment is different from the first embodiment in that multiplexers 4 and 6 are replaced with multiplexers 4# and 6#, respectively.

Multiplexer 4# selects one of the three inputs. The input node s1 receives an input of the internal voltage Vin. The input node s2 receives an input of the reference voltage Vref. The input node s3 receives the reference voltage generated at the node Nd. Multiplexer 6# selects one of the two inputs. The input node u1 receives the reference voltage generated at the node Nd.

The input node u2 receives an input of the ground voltage GND. FIG. 16 is a diagram illustrating a reference voltage generated at the node Nd under the control of the switches SW4 to SW7 according to the third embodiment.

Referring to FIG. 16, a combination of ON/OFF of the switches SW4 to SW7 is shown.

The reference voltage generated at the node Nd according to the combination is shown. Here, reference voltages in the case where the ratio of the resistance elements R0, R1, R2, and R3 is set to 1:2:3:2, respectively, are shown.

Here, the case where 10 kinds of reference voltages can be set is shown. In this example, seven types of reference voltages are used.

Figures 17, 18:
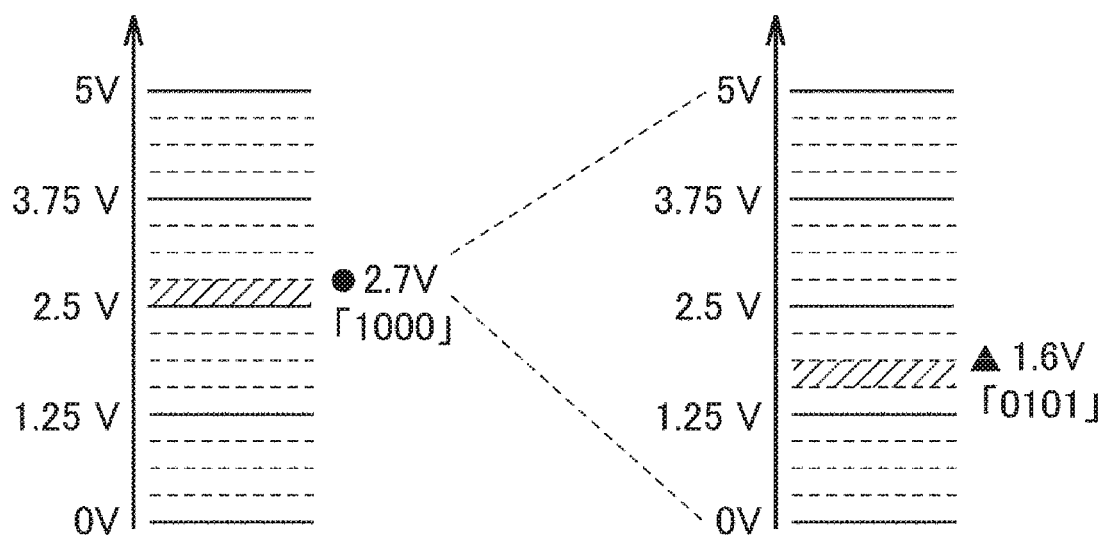
FIG. 17 is a diagram illustrating the relationship between each reference voltage according to the third embodiment and the difference thereof.
FIG. 18 is a diagram illustrating a voltage detection range of an A/D conversion circuit 20 according to the third embodiment.

FIG. 17 is a diagram for explaining the relationship between each reference voltage and its difference according to the third embodiment. As shown in FIG. 17, among the reference voltages shown in FIG. 16, 4.09V, 3.75V, 3.21V, 3.00V, 2.50V, 1.88V, and 0V are used as the reference voltages Vref1~Vref7.

"1101", "1100", "1011", "1010", "1000", "0110" and "0000" are stored in the memory 50 as the digital signals D4, D3, D2 and D1 corresponding to the voltage values of the reference voltage Vref1~Vref7, respectively.

Also, in this configuration, the A/D conversion circuit 20 can perform the first and second conversion operations on the analog output signal Vout in the same manner as in the first embodiment.

FIG. 18 is a diagram illustrating a voltage detection range of the A/D conversion circuit 20 according to the third embodiment. Here, a case where the internal voltage Vin (2.7V) is input will be described. In the present example, the amplification gain G is 8.

As shown in FIG. 18, the A/D conversion circuit 20 has a voltage detection range of 0 to 5V as an example.

In the first conversion operation (first measurement), the A/D conversion circuit 20 performs a conversion operation in the voltage detection range 0 to 5V with respect to the internal voltage Vin1 (2.7V). The A/D conversion circuit 20 divides the voltage detection range of 0 to 5V into 16 regions and outputs 4-bit digital signals D4, D3, D2, and D1.

In this embodiment, the internal voltages Vin1 (2.7V) is included in region corresponding to the digital signals D4, D3, D2, and D1 ("1", "0", "0", and "0").

The serial-parallel conversion circuit 30 receives the output data DATA of the A/D conversion circuit 20, converts the received output data into parallel signals, and stores the parallel signals in the memory 50.

Next, in the second conversion operation (second measurement), the A/D conversion circuit 20 performs the conversion operation in the voltage detection range 0 to 5V on the analog output voltage Vout, which is the difference voltage between the internal voltage Vin1 (2.7V) and the internal voltage Vin2 (2.5V), in accordance with the amplification gain G (8 times).

When the amplification gain G is 8 times, the conversion operation in the range of 100% is executed for the voltage detection range 0 to 5V of the A/D conversion circuit 20.

The A/D conversion circuit 20 divides the voltage detection range of 0 to 5V into 16 regions and outputs 4-bit digital signals D4, D3, D2, and D1.

The difference voltage between the internal voltage Vin1 and the internal voltage Vin2 is 0.2V. Therefore, the analog output signal Vout of the differential amplifier 40 is set to 0.2×amplification gain G (8)=1.6V.

The A/D conversion circuit 20 receives the analog output signal Vout of 1.6V and performs a second conversion operation on the analog output signal Vout. The A/D conversion circuit 20 outputs 4-bit digital signals D4, D3, D2, and D1 of the second bit.

The A/D conversion circuit 20 receives the analog output signal Vout (1.6V), and outputs the digital signals D4 to D1 ("0101") of 4 bits of the second bit by the A/D conversion operation.

The serial-parallel conversion circuit 30 receives the output data DATA of the A/D conversion circuit 20, converts the received output data into parallel signals, and stores the parallel signals in the memory 50.

Although not shown, the control unit 10 includes a synthesizing unit 12 and a correction unit 14. The synthesizing unit 12 performs a synthesizing process on the data DATA stored in the memory 50, and outputs an output data DOUT via external pins.

In this embodiment, the synthesizing unit 12 acquires a digital signal corresponding to the reference voltage Vref5 close to the analog output voltage Vout according to the first conversion operation as a digital signal of the analog output signal Vout based on the digital signals D4, D3, D2, and D1. In this example, the synthesizing unit 12 acquires "0x10000000".

Next, the synthesizing unit 12 refers to the digital signals D4 to D1 ("0101") which are the output data DATA of the second conversion operation stored in the memory 50.

The synthesizing unit 12 calculates the output data DATA when the A/D converter 20 performs the conversion operation in the 100% range as shown in the following equation.

0x0101×8/8=0x0101. The synthesizing unit 12 outputs, as a digital signal of the analog output signal Vout, a synthesized digital signal synthesized from a digital signal corresponding to the reference voltage Vref5 close to the analog output signal Vout according to the first conversion operation and a digital signal corresponding to the difference voltage between the inner voltage Vin and the reference voltage Vref5.

The synthesizing unit 12 adds "0x10000000" corresponding to the reference voltage Vref2 and "0x0101" corresponding to the difference voltage, and outputs the result as output data DOUT ("0x10000101").

Various reference voltages can be generated by providing the switch control unit SWC1, SWC2 for changing the connecting relation of the resistive elements R0 to R3 according to the third embodiment.

For example, by generating seven kinds of reference voltages, a 4-bit digital signal (data. D4, D3, D2, D1) corresponding to a reference voltage close to the analog output signal Vout according to the first conversion operation is acquired as a digital signal of the analog output signal Vout according to the above method. Then, 4-bit digital signals (data D4, D3, D2, and D1) corresponding to the difference voltage between the internal voltage Vin and the reference voltage according to the second conversion operation are acquired.

The synthesizing unit 12 outputs a digital signal obtained by synthesizing a 4-bit digital signal corresponding to a reference voltage close to the analog output signal Vout according to the first conversion operation and a 4-bit digital signal corresponding to a difference voltage between the internal voltage Vin and the reference voltage according to the second conversion operation.

This processing makes it possible to perform an A/D conversion operation with high precision and high resolution (8 bits).

By the method according to the third embodiment, it is possible to set a plurality of types (seven types) of reference voltages without increasing the number (four) of resistance elements by changing the connection relationship. It is possible to realize an 8-bit high-resolution A/D converter by using the A/D conversion circuit 20 having 4-bit resolution twice. That is, it is possible to realize an A/D converter with high accuracy by a simple method.

The Other Embodiments

In the above embodiment, the configuration of the A/D converter including the A/D conversion circuit 20 has been described, but it is also possible to adopt a configuration in which the A/D conversion circuit 20 and other parts are separated.

Figure 19:
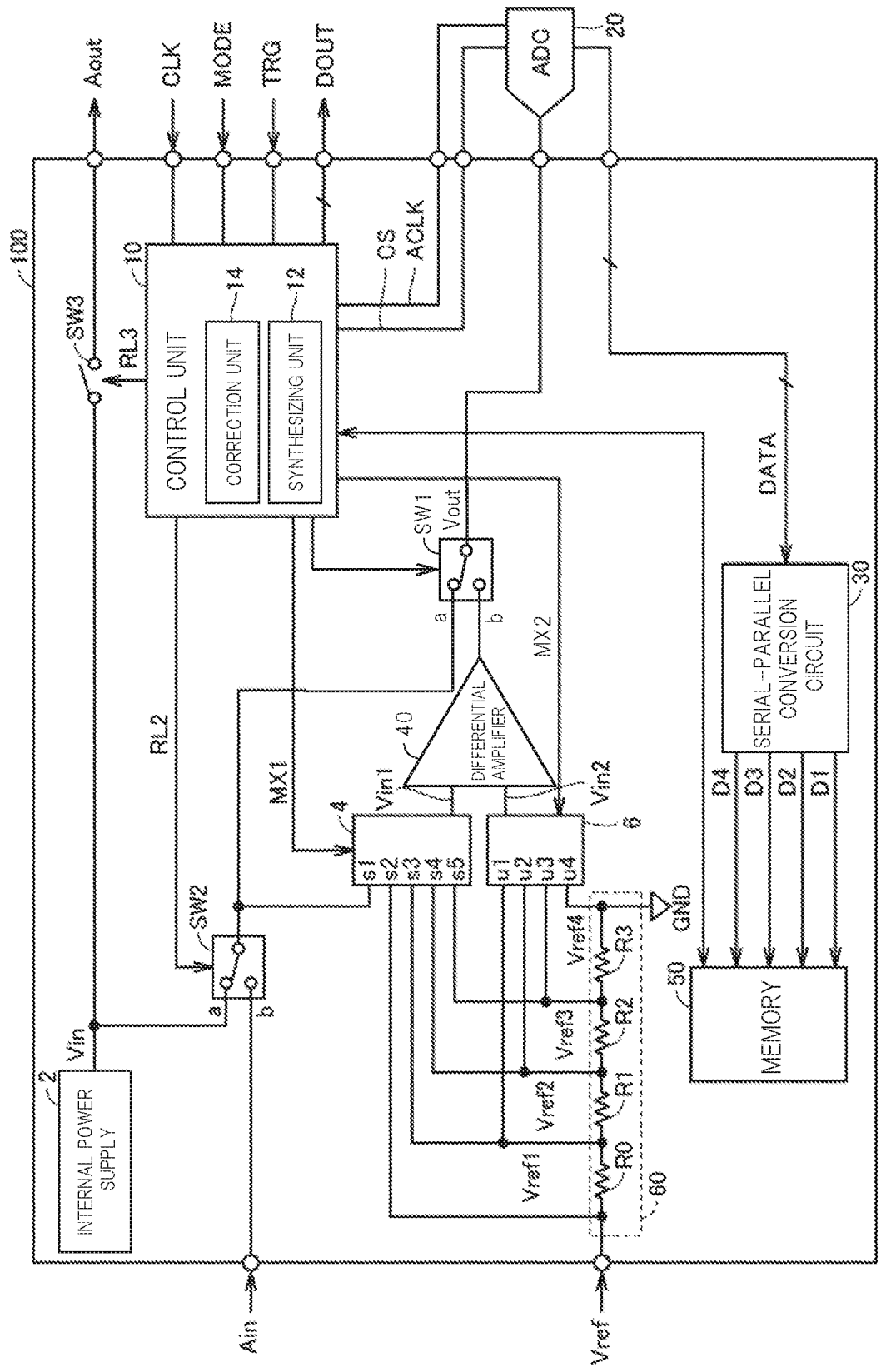
FIG. 19 is a diagram illustrating an A/D conversion circuit and a control apparatus 100 in accordance with another embodiment.

FIG. 19 is a diagram illustrating an A/D conversion circuit 20 and a control device 100 according to another embodiment.

Referring to FIG. 19, it is different from the A/D converter 1 of FIG. 1 in that a control device 100 for controlling the A/D conversion circuit 20 is provided independently of the A/D conversion circuit 20.

The control device 100 has a configuration excluding the A/D conversion circuit 20 as compared with the A/D converter 1 of FIG. 1. Since the other configurations are the same as those described with reference to FIG. 1, the detailed description thereof will not be repeated.

The control unit 10 of the control device 100 outputs a control signal for controlling the A/D conversion circuit 20 via an external pin.

The A/D conversion circuit 20 operates in accordance with control signals inputted through external pins, and outputs a result of the A/D conversion process to the controller 100 as a data DATA.

The serial parallel conversion circuit 30 of the control device 100 receives a data DATA from the A/D conversion circuit 20 via external pins.

Also, in this configuration, it is possible to execute the A/D conversion operation according to the same method as that of the first embodiment.

By replacing the A/D conversion circuit 20, the resolution of the A/D conversion device can be easily changed. The control device 100 can also be used for other A/D conversion circuits.

Although the present disclosure has been specifically described based on the embodiments described above, the present disclosure is not limited to the embodiments, and it is needless to say that various modifications can be made without departing from the gist thereof.

What is claimed is:

1. An A/D converter comprising:
an A/D conversion circuit that converts an analog output signal into a digital signal of a plurality of bits; and
a control circuit that controls the A/D conversion circuit,
wherein the control circuit acquires a first bit indicating a level region among a plurality of level regions in which a voltage level of the analog output signal falls, in accordance with a first conversion operation by the A/D conversion circuit, sets a reference voltage corresponding to the level region based on the acquired first bit, amplifies a difference voltage between the analog output signal and the reference voltage so as to correspond to an A/D conversion input range of the A/D conversion circuit to output an amplified analog output signal to the A/D conversion circuit, acquires a second bit indicating a voltage level of the amplified analog output signal in accordance with a second conversion operation by the A/D conversion circuit, and synthesizes the first bit and the second bit to generate the digital signal of the plurality of bits.

2. The A/D converter according to claim 1,
wherein the A/D conversion circuit has L-bit resolution,
wherein the first bit comprises M bits in accordance with the number of level regions in the first conversion operation,
wherein L and M are integers, and
wherein M is equal to or smaller than L.

3. The A/D converter according to claim 2,
wherein the second bit comprises N bits,
wherein N is an integer, and
wherein M N is larger than L.

4. The A/D converter according to claim 1, wherein the control circuit synthesizes the first bit as upper bits of the digital signal and the second bit as lower bits of the digital signal.

5. The A/D converter according to claim 1,
wherein the control circuit includes:
a memory that stores information on the first bit according to the first conversion operation by the A/D conversion circuit;
a reference voltage setting unit that sets the reference voltage based on the information stored in the memory; and
an amplifier circuit that amplifies the difference voltage between the analog output signal and the reference voltage so as to correspond to the A/D conversion input range of the A/D conversion circuit to output the amplified analog output signal to the A/D conversion circuit,
wherein the memory further stores information on the second bit according to the second conversion operation by the A/D conversion circuit, and
wherein the control circuit further includes the synthesizing unit that synthesizes the first bit and the second bit stored in the memory to output the digital signal.

6. The A/D converter according to claim 5, wherein the reference voltage setting unit includes a plurality of resistance elements provided between a first voltage and a second voltage, and a selection circuit that selects one of a plurality of reference voltages generated by resistance division with the plurality of resistance elements based on the first bit.

7. The A/D converter according to claim 6 further comprising a switching circuit that switches the difference voltage input to the amplifier circuit,
wherein the switching circuit switches to a difference voltage applied between an input node and an output node of each resistance element, in the reference voltage setting unit as the difference voltage input to the amplifier circuit,
wherein the amplifier circuit amplifies the difference voltage to output the amplified analog output signal to the A/D conversion circuit,
wherein the control circuit acquires the second bit indicating the voltage level of the amplified analog output signal according to the first conversion operation by the A/D conversion circuit, and
wherein the control circuit further includes a correction unit that sets a digital signal corresponding to the reference voltage based on the acquired digital signal.

8. The A/D converter according to claim 7, wherein the correction unit includes a correction table that corrects the digital signal corresponding to the reference voltage according to a temperature.

9. The A/D converter according to claim 8, wherein the correction table includes a rate of change of the reference voltage that changes in accordance with the temperature and an offset value.

10. The A/D converter according to claim 6, wherein the reference voltage setting unit further includes a switch control unit that switches the connection relationship of the plurality of resistance elements.

11. The A/D converter according to claim 10,
wherein the plurality of resistance elements comprises a first to a fourth resistance element,
wherein the switch control unit includes a first to a fourth switch circuit connected in series corresponding to the first to the fourth resistive element respectively,
wherein the first resistance element and the first switch circuit are connected between a power supply node and an intermediate node in parallel with the second resistance element and the second switch circuit, wherein the third resistance element and the third switch circuit are connected between the intermediate node and the ground node in parallel with the fourth resistance element and the fourth switch circuit.

12. A semiconductor device for controlling an A/D conversion circuit to convert an analog output signal into a digital signal of a plurality of bits, wherein the semiconductor device outputs the analog output signal to the A/D conversion circuit, acquires a first bit indicating a level region among a plurality of level regions in which a voltage level of the analog output signal falls, in accordance with a first conversion operation by the A/D conversion circuit, sets a reference voltage corresponding to the level region based on the acquired first bit, amplifies a difference voltage between the analog output signal and the reference voltage so as to correspond to an A/D conversion input range of the A/D conversion circuit to output an amplified analog output signal to the A/D conversion circuit, acquires a second bit indicating a voltage level of the amplified analog output signal in accordance with a second conversion operation by the A/D conversion circuit, and synthesizes the first bit and the second bit to generate the digital signal of the plurality of bits.

* * * * *